United States Patent
Ogawa

(10) Patent No.: US 8,954,916 B2
(45) Date of Patent: Feb. 10, 2015

(54) TEST CIRCUIT, INTEGRATED CIRCUIT, AND TEST CIRCUIT LAYOUT METHOD

(75) Inventor: Kazuhisa Ogawa, Kanagawa (JP)

(73) Assignee: Sony Corporation, Tokyo (JP)

(*) Notice: Subject to any disclaimer, the term of this patent is extended or adjusted under 35 U.S.C. 154(b) by 338 days.

(21) Appl. No.: 13/536,639

(22) Filed: Jun. 28, 2012

(65) Prior Publication Data
US 2013/0009314 A1   Jan. 10, 2013

(30) Foreign Application Priority Data

Jul. 8, 2011   (JP) ................................. 2011-152141
Feb. 29, 2012  (JP) ................................. 2012-043216

(51) Int. Cl.
G06F 17/50   (2006.01)
H01L 21/66   (2006.01)

(52) U.S. Cl.
CPC ............ *H01L 22/34* (2013.01); *G06F 17/5068* (2013.01)
USPC ............ 716/136; 716/119; 716/129; 716/130

(58) Field of Classification Search
CPC ........... H01L 2224/48465; H01L 2224/49175; H01L 2224/92247; H01L 2224/85; H01L 24/49; H01R 2201/20; G06F 17/5068
USPC ................................ 716/119, 129, 130, 136
See application file for complete search history.

(56) References Cited

U.S. PATENT DOCUMENTS

| | | | | |
|---|---|---|---|---|
| 5,943,285 A | * | 8/1999 | Kohno | 365/230.03 |
| 6,041,013 A | * | 3/2000 | Kohno | 365/230.03 |
| 6,407,563 B2 | * | 6/2002 | Ohtaki | 324/754.08 |
| 7,362,085 B2 | * | 4/2008 | Tsudaka et al. | 324/66 |
| 7,489,151 B2 | | 2/2009 | Hess et al. | |

* cited by examiner

*Primary Examiner* — Sun Lin
(74) *Attorney, Agent, or Firm* — Sony Corporation

(57) ABSTRACT

A test circuit includes a substrate, a wiring section having a plurality of pieces of wiring, and a device-under-test section formed on the substrate, and having a device-under-test main body and a plurality of connecting electrodes for establishing connection between the main body and the plurality of pieces of wiring, an extending direction of a straight line connecting a position of a center of rotation in a plane of pattern formation of the main body and each electrodes being inclined at a predetermined angle to an extending direction of the pieces of wiring, and the connecting electrodes being arranged at positions such that connection relation between the electrodes and the plurality of pieces of wiring is maintained even when the main body and the electrodes are rotated about the position of the center of rotation by 90 degrees relative to the wiring section in the plane of the pattern formation.

11 Claims, 14 Drawing Sheets

FIG. 6A
FIG. 6B
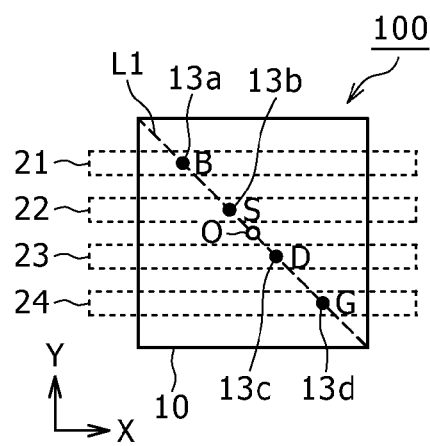
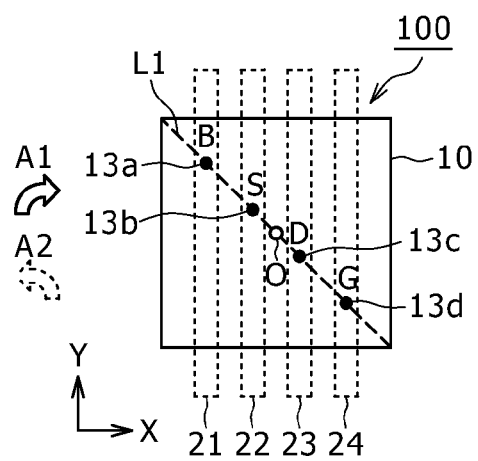

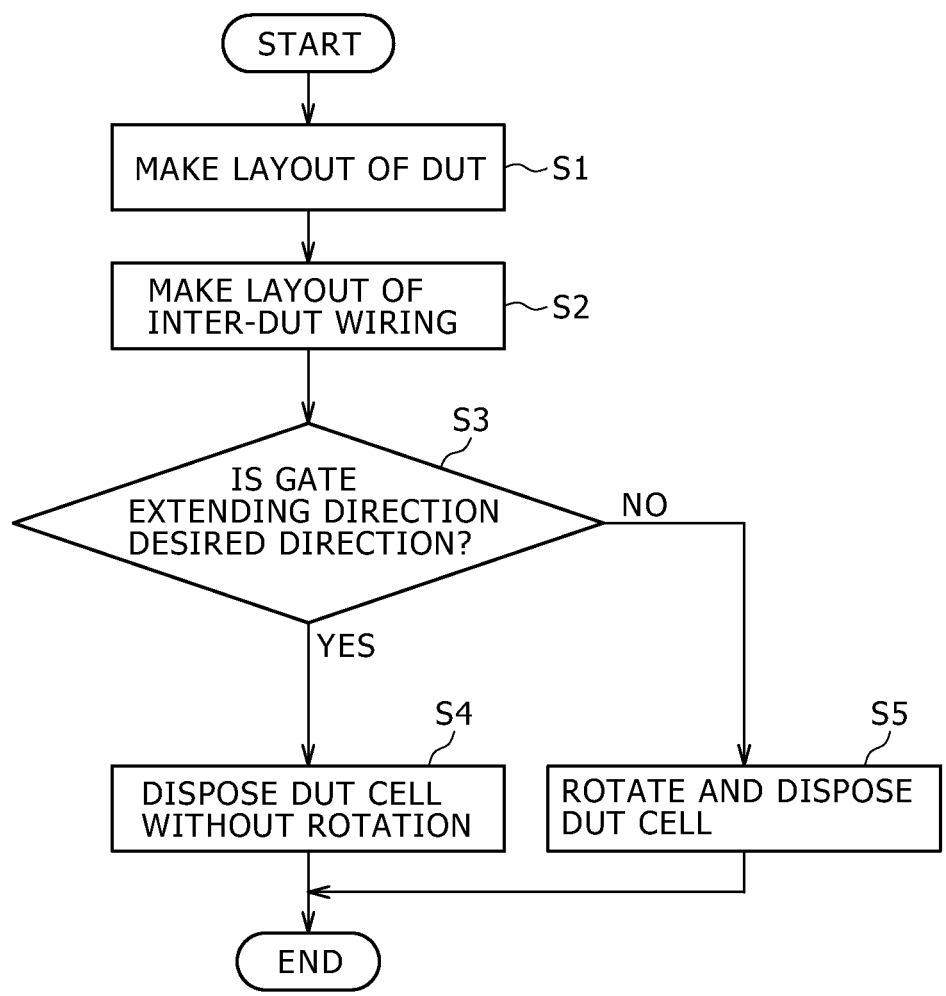

FIG. 9
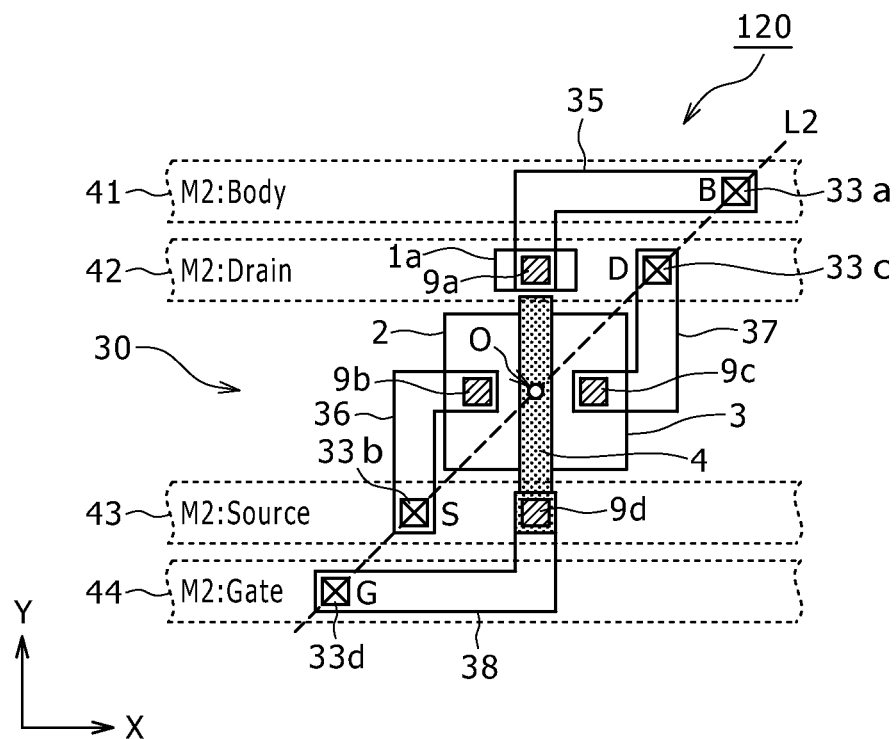
FIG. 10A  FIG. 10B
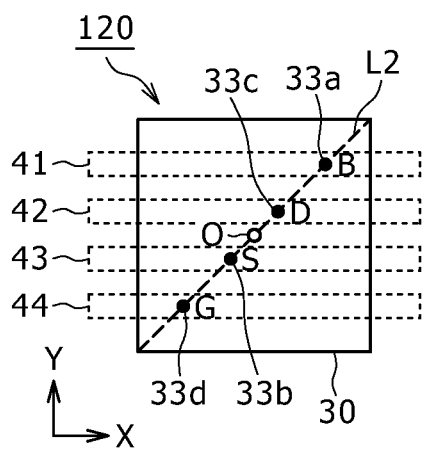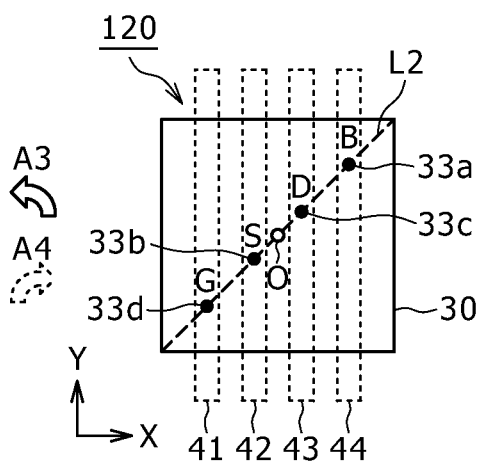

FIG.18A
FIG.18B
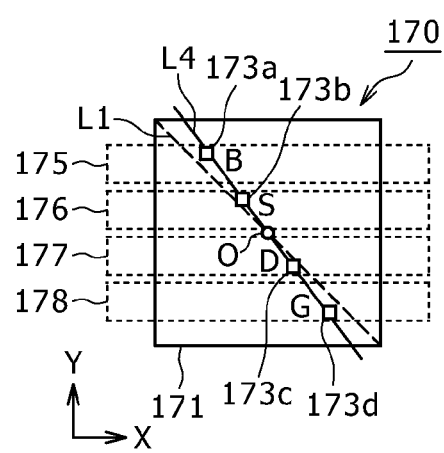
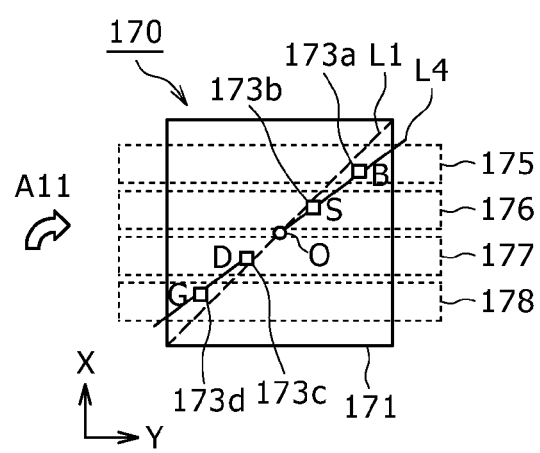

TEST CIRCUIT, INTEGRATED CIRCUIT, AND TEST CIRCUIT LAYOUT METHOD

BACKGROUND

The present disclosure relates to a test circuit including a device under test which is used for performance evaluation at a wafer level in the middle of manufacture of a semiconductor device, for example, and a layout method for the test circuit, and an integrated circuit fabricated by using a same layout method as the layout method for the test circuit.

In related art, a test structure for wafer shipment inspection, which is referred to as a TEG (Test Element Group), is provided on a wafer (substrate) to perform electrical performance evaluation at a wafer level in the middle of a process of manufacturing a semiconductor device. The test structure generally includes a plurality of devices under test (hereinafter referred to as DUTs), an electrode pad to be brought into contact with a probe of an evaluating device such as a wafer tester, for example, and connecting wiring (connecting pin) for establishing electric connection between the DUTs and the electrode pad.

In addition, in related art, various layout design patterns in such a test structure have been proposed (see U.S. Pat. No. 7,489,151, referred to as Patent Document 1 hereinafter, for example). FIG. 21 shows a schematic configuration of a layout design pattern of a test structure proposed in Patent Document 1. Incidentally, FIG. 21 is a schematic plan view of one DUT and the vicinity of the DUT.

Patent Document 1 describes an example using a MOS (Metal-Oxide-Semiconductor) transistor 200 as a DUT. According to Patent Document 1, as shown in FIG. 21, a connecting pin formed by an L-shaped routing structure 201 is connected to each of a gate, a drain, a source, and a well (body) of the MOS transistor 200.

SUMMARY

The above-described test structure is generally disposed on a scribe line formed so as to extend in a predetermined direction and/or a scribe line formed so as to extend in a direction orthogonal to the predetermined direction within the wafer. Therefore, when the general shape of a region of formation of the test structure is a horizontally long shape, for example, the layout design pattern of the whole of the test structure needs to be rotated by 90 degrees according to the extending direction of the scribe line on which the test structure is disposed at a time of design.

In such a situation, when the layout design pattern of the whole of the test structure is rotated by 90 degrees without the layout design pattern within the test structure being changed, the following problems occur, for example. In a case where the DUTs within the test structure are a MOS transistor, for example, gate electrodes extend in a mixture of a predetermined direction and a direction orthogonal to the predetermined direction according to the extending directions of the scribe lines on which the test structure is disposed. In this case, variations in size of the gate electrodes are increased in a process of fabricating the test structure (see for example "Intra-Field Gate CD Variability and Its Impact On Circuit Performance," IEDM 1999, pp. 479-482).

Incidentally, in order to deal with such a problem, advanced process technology such as forms a pattern having a size of less than 40 nm, for example, may specify that gate electrodes extend in one uniform direction according to a design rule. In this case, however, the layout design pattern of the whole of the test structure needs to be corrected according to the extending direction of the scribe line on which the test structure is disposed, and therefore the design takes much time.

However, the following method, for example, may be conceivable as a simple layout design pattern correcting method for making the gate electrodes extend in a uniform direction. First, the design data of a test structure including DUTs is subjected to cell layering. Then, only the design data of a DUT layer (cell data of the DUTs) is rotated by 90 degrees in an opposite direction from the direction of rotation of the whole of the test structure.

However, this correcting method causes wiring provided in a higher-level layer than the DUTs (which will be referred to as higher-level wiring) and the positions of connecting pins between the higher-level wiring and the DUTs to be also rotated because of the configuration of the design data, and therefore requires that the positions of the connecting pins and/or the pattern of the higher-level wiring be corrected. Therefore, even the use of such a layout design pattern correcting method presents a problem of the design taking much time.

The present disclosure has been made to solve the above problems. It is desirable to provide a test circuit that can be fabricated by a simpler design method even when the layout design pattern of the whole of a test structure needs to be rotated by 90 degrees at a time of design, and a layout method for the test circuit. It is also desirable to provide an integrated circuit fabricated by using a method similar to the test circuit layout method according to one embodiment of the present disclosure.

A test circuit according to one embodiment of the present disclosure includes a substrate, a wiring section formed on the substrate, and a device-under-test section formed on the substrate. The configuration of each of the parts is as follows. The wiring section has a plurality of pieces of wiring. The device-under-test section has a device-under-test main body and a plurality of connecting electrodes for establishing connection between the device-under-test main body and the plurality of pieces of wiring, respectively. Then, in the test circuit according to the embodiment of the present disclosure, a direction of a straight line connecting a position of a center of rotation in a plane of pattern formation of the device-under-test main body and each of the plurality of connecting electrodes is inclined at a predetermined angle to an extending direction of the plurality of pieces of wiring. Further, in the embodiment of the present disclosure, the plurality of connecting electrodes are arranged at positions such that connection relation between the plurality of connecting electrodes and the plurality of pieces of wiring is maintained even when the device-under-test main body and the plurality of connecting electrodes are rotated about the position of the center of rotation by 90 degrees relative to the wiring section in the plane of the pattern formation.

Incidentally, the "position of the center of rotation" in the present specification is the central position of a region of formation of the device-under-test section (or a device element main body to be described later and the plurality of connecting electrodes) in the plane of the pattern formation of the device-under-test main body (or the device element main body to be described later). When the design data of the test circuit (or a device element section to be described later) is rotated by 90 degrees at a time of design, the design data of the device-under-test section (or the device element main body and the plurality of connecting electrodes) is rotated about the position of the center of rotation.

In addition, an integrated circuit according to one embodiment of the present disclosure includes a substrate, a wiring section formed on the substrate, and a device element section formed on the substrate. The configuration of each of the parts is as follows. The wiring section has a plurality of pieces of wiring. The device element section has a device element main body and a plurality of connecting electrodes for establishing connection between the device element main body and the plurality of pieces of wiring, respectively. Then, in the integrated circuit according to the embodiment of the present disclosure, an extending direction of a straight line connecting a position of a center of rotation in a plane of pattern formation of the device element main body and each of the plurality of connecting electrodes is inclined at a predetermined angle to an extending direction of the plurality of pieces of wiring. Further, in the embodiment of the present disclosure, the plurality of connecting electrodes are arranged at positions such that connection relation between the plurality of connecting electrodes and the plurality of pieces of wiring is maintained even when the device element main body and the plurality of connecting electrodes are rotated about the position of the center of rotation by 90 degrees relative to the wiring section in the plane of the pattern formation.

Further, a test circuit layout method according to one embodiment of the present disclosure is a method for creating a layout design pattern of the test circuit according to the above-described embodiment of the present disclosure. The test circuit layout method includes creating a layout pattern of a wiring section and creating a layout pattern of a device-under-test section.

In the test circuit (integrated circuit) according to the above-described embodiment of the present disclosure, the extending direction of the straight line connecting the position of the center of rotation in the plane of pattern formation of the device-under-test main body (device element main body) and each of the connecting electrodes is inclined at the predetermined angle to the extending direction of the plurality of pieces of wiring. Further, in the test circuit according to the above-described embodiment of the present disclosure, the plurality of connecting electrodes are arranged at positions such that the connection relation between the plurality of connecting electrodes and the plurality of pieces of wiring is maintained even when the device-under-test section is rotated about the position of the center of rotation by 90 degrees relative to the wiring section in the plane of the pattern formation of the device-under-test section. Further, also in the integrated circuit according to the above-described embodiment of the present disclosure, the plurality of connecting electrodes are arranged at positions such that the connection relation between the plurality of connecting electrodes and the plurality of pieces of wiring is maintained even when the device element main body and the plurality of connecting electrodes are rotated by 90 degrees relative to the wiring section in the plane of the pattern formation of the device element main body and the plurality of connecting electrodes. Therefore, in the test circuit (integrated circuit) according to the above-described embodiment of the present disclosure, when the test circuit (device element section) needs to be rotated by 90 degrees at a time of design, the provision can be made by merely rotating the device-under-test section (the device element main body and the plurality of connecting electrodes) by 90 degrees relative to the wiring section.

As described above, in the present disclosure, when the test circuit (device element section) is rotated by 90 degrees at a time of design, it suffices only to rotate the device-under-test section (the device element main body and the plurality of connecting electrodes) by 90 degrees relative to the wiring section. That is, design techniques for the test circuit (integrated circuit) according to the above-described embodiment of the present disclosure eliminate a need to correct the positions of the connecting electrodes, the pattern of wiring, or the like. Therefore, according to the present disclosure, the test circuit (integrated circuit) can be designed more easily.

BRIEF DESCRIPTION OF THE DRAWINGS

FIGS. 6A and 6B are diagrams of assistance in explaining an example of an operation of rotating the test structure according to the first embodiment;

FIG. 7 is a flowchart showing an example of a procedure of a layout method for the test structure according to the first embodiment;

FIG. 9 is a schematic plan view of a test structure according to a second embodiment;

FIGS. 10A and 10B are diagrams of assistance in explaining an example of an operation of rotating the test structure according to the second embodiment;

FIGS. 18A and 18B are diagrams showing the arrangement positions of each connecting pin before and after an operation of rotating a test structure according to an example of modification 1-2;

DETAILED DESCRIPTION OF THE PREFERRED EMBODIMENTS

An example of test circuits and methods for layout of the test circuits according to embodiments of the present disclosure and an integrated circuit fabricated using a method similar to the methods for layout of the test circuits according to the embodiments of the present disclosure will be described in the following order with reference to the drawings. However, the present disclosure is not limited to the following example.

Figure 1:
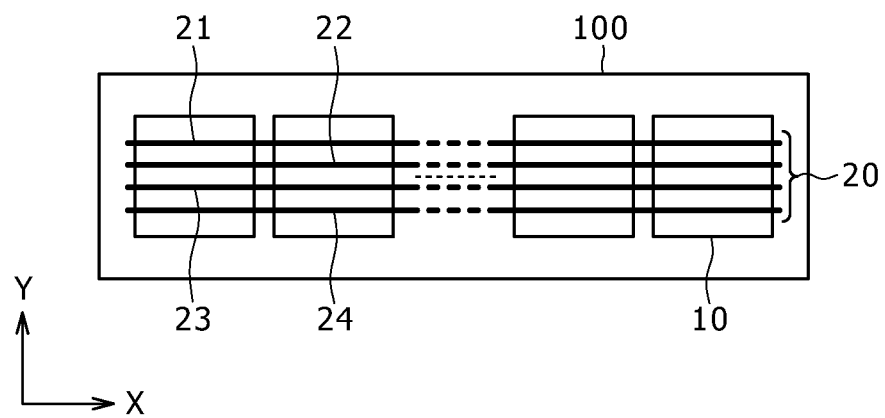
FIG. 1 is a schematic block diagram of a test structure according to a first embodiment.

1. First Embodiment: First Example of Configuration in which All Pieces of Higher-Level Wiring Extend in Same Direction
2. Second Embodiment: Second Example of Configuration in which All Pieces of Higher-Level Wiring Extend in Same Direction
3. Third Embodiment: Third Example of Configuration in which All Pieces of Higher-Level Wiring Extend in Same Direction
4. Fourth Embodiment: Fourth Example of Configuration in which All Pieces of Higher-Level Wiring Extend in Same Direction
5. Fifth Embodiment: Example of Configuration in which Part of Pieces of Higher-Level Wiring Extend in Different Direction from Extending Direction of Other Pieces of Higher-Level Wiring
6. Various Examples of Modification
7. Example of Application: Example of Configuration of Integrated Circuit 1. First Embodiment Configuration of Test Structure FIG. 1 shows a schematic configuration of a test structure (test circuit) for wafer shipment inspection according to a first embodiment of the present disclosure. The test structure 100 according to the present embodiment includes: a plurality of DUTs 10 arranged in one row (device-under-test section); a plurality of test electrode pads (not shown); and a wiring section 20 having a plurality of pieces of higher-level wiring for respectively establishing connection between the plurality of test electrode pads and each DUT 10. In addition, though not shown in FIG. 1, the test structure 100 has a semiconductor substrate (substrate). The DUTs 10, the test electrode pads, and the wiring section 20 are formed on the semiconductor substrate.

Incidentally, while FIG. 1 shows an example in which a plurality of DUTs 10 are arranged in one row in a predetermined direction (X-axis direction in FIG. 1), the present disclosure is not limited to this. The form of arrangement of the plurality of DUTs 10 can be changed as appropriate according to conditions such for example as a use and a kind of device forming the DUTs 10. Therefore, the shape of a region of formation of the test structure 100 in a plane of formation of the test structure 100 (in a X-Y plane in FIG. 1) is not limited to the rectangular shape (horizontally long shape) shown in FIG. 1, but can be changed as appropriate according to the form of arrangement of the plurality of DUTs 10.

In the present embodiment, description will be made of a case where a DUT main body 10a to be described later that is included in a DUT 10 is a MOS transistor (the configuration of the DUT 10 will be described later in detail). Therefore, four pieces of higher-level wiring 21 to 24 (which will be referred to as a first piece of inter-DUT wiring 21 to a fourth piece of inter-DUT wiring 24, respectively) connected to a well (body), a source, a drain, and a gate, respectively, of the MOS transistor are provided within the wiring section 20. Incidentally, each piece of inter-DUT wiring (wiring) is also connected to a corresponding test electrode pad.

In addition, in the test structure 100 according to the present embodiment, the first to fourth pieces of inter-DUT wiring 21 to 24 are shared between the plurality of DUTs 10. Further, in the present embodiment, as will be described later, a second interlayer insulating film 12 is formed on a metal layer M1 in which each internal wiring of the DUT 10 is formed, and the first to fourth pieces of inter-DUT wiring 21 to 24 are formed on the surface of the second interlayer insulating film 12 (see FIG. 3 and FIG. 4 to be described later). That is, in the present embodiment, the first to fourth pieces of inter-DUT wiring 21 to 24 are formed in one metal layer M2.

Incidentally, the design data of the test structure 100 is layered. The layer of design data of the wiring section 20 (first to fourth pieces of inter-DUT wiring 21 to 24) is at a higher level than the layer of cell data of each DUT 10. Therefore, connection relation between the first to fourth pieces of inter-DUT wiring 21 to 24 and each DUT 10 is constructed by quoting the cell data of each DUT 10 as the lower-level layer in the layer of the wiring section 20 in the design data.

[Configuration of DUT]

Figure 2:
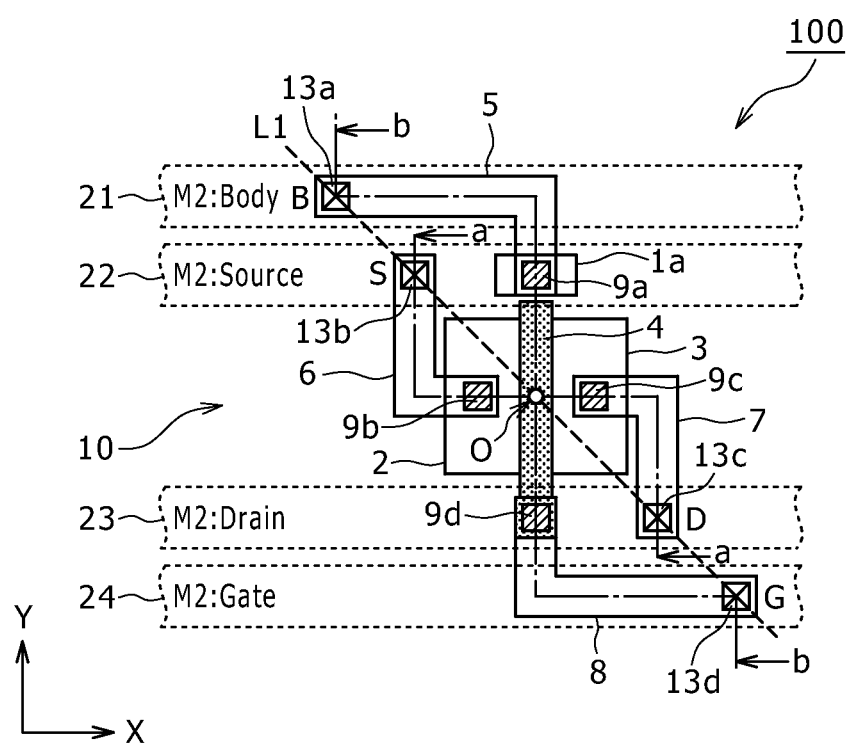
FIG. 2 is a schematic plan view of the test structure according to the first embodiment.
Figure 3:
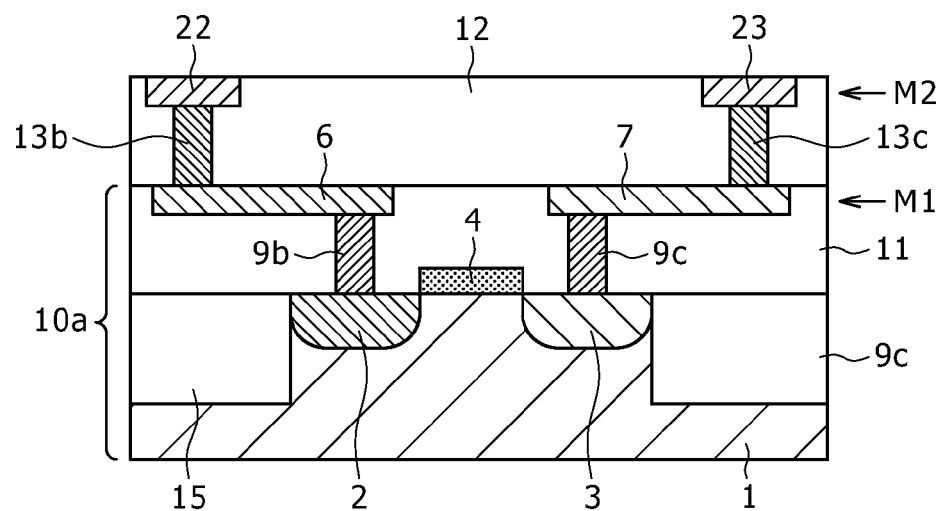
FIG. 3 is a sectional view taken along a line a-a in FIG. 2.
Figure 4:
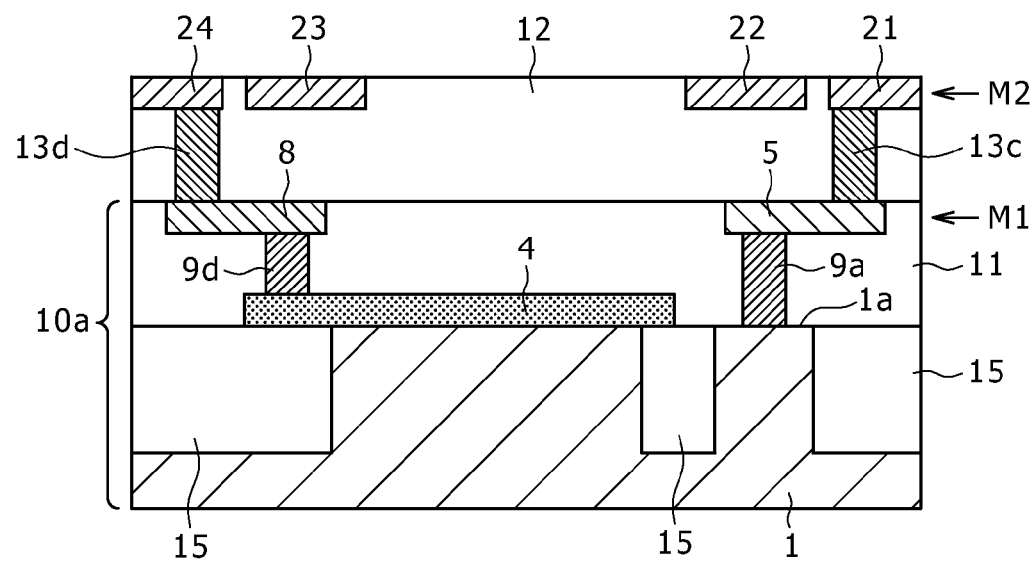
FIG. 4 is a sectional view taken along a line b-b in FIG. 2.

The configuration of each DUT will next be described in more detail with reference to FIGS. 2 to 4. FIG. 2 is a schematic plan view of a layout design pattern of the DUT 10 and the first to fourth pieces of inter-DUT wiring 21 to 24 before the rotation of the test structure 100 according to the present embodiment (state before the rotation of the test structure 100 will be referred to as a basic state). FIG. 3 is a sectional view taken along a line a-a in FIG. 2. FIG. 4 is a sectional view taken along a line b-b in FIG. 2. Incidentally, as shown in FIG. 2, the present embodiment represents an example in which each piece of inter-DUT wiring extends in a direction (X-axis direction in FIG. 2) orthogonal to the extending direction of a gate electrode 4 to be described later (Y-axis direction in FIG. 2, which will be referred to as a gate direction) in the basic state.

As shown in FIGS. 2 to 4, the DUT 10 includes a DUT main body 10a (MOS transistor) and a second interlayer insulating film 12 formed on one surface (on the side of the metal layer M1) of the DUT main body 10a. The DUT 10 further includes four connecting electrodes 13a to 13d (hereinafter referred to as a first connecting pin 13a to a fourth connecting pin 13d) formed so as to penetrate through the second interlayer insulating film 12. Incidentally, as shown in FIGS. 3 and 4, the first to fourth pieces of inter-DUT wiring 21 to 24 of the wiring section 20 (metal layer M2) are disposed so as to be buried in the surface of the second interlayer insulating film 12 which is on the opposite side from the side of the metal layer M1.

The DUT main body 10a includes a semiconductor substrate (substrate: not shown) as well as a well region 1, a source region 2, a drain region 3, a gate electrode 4, and an element isolation layer 15 disposed within the semiconductor substrate.

The well region 1 is for example formed by an impurity layer of a P-type as a carrier polarity. The source region 2 and the drain region 3 are for example formed by an impurity layer of an N-type as a carrier polarity. The source region 2 and the drain region 3 are formed so as to be buried in a predetermined region within the surface of the well region 1 which is on the side of the gate electrode 4.

The gate electrode 4 is formed by a metallic film extending in a direction (Y-axis direction in FIG. 2) orthogonal to the extending direction of each piece of inter-DUT wiring. As shown in FIG. 2, the gate electrode 4 is formed on a region of the well region 1 which is between the source region 2 and the drain region 3, and is formed in an extending manner so as to traverse substantially the center of the well region 1.

As shown in FIG. 3 and FIG. 4, the element isolation layer 15 is formed so as to be buried in the surface of the well region 1 which is on the side of the gate electrode 4, and is formed so as to cover the peripheries of regions of formation of a well connecting part 1a, the source region 2, the drain region 3, and the gate electrode 4.

The DUT main body 10a also includes a first interlayer insulating film 11 and internal wiring (a body wiring film 5, a source wiring film 6, a drain wiring film 7, and a gate wiring film 8) formed on the surface of the first interlayer insulating film 11 which is on an opposite side from the side of the well region 1. That is, in the DUT 10 according to the present embodiment, the body wiring film 5, the source wiring film 6, the drain wiring film 7, and the gate wiring film 8 are formed in one metal layer (metal layer M1 in FIG. 3 and FIG. 4). Incidentally, as shown in FIG. 2, the body wiring film 5, the source wiring film 6, the drain wiring film 7, and the gate wiring film 8 are each formed by a metallic film extending in substantially the shape of an L in the plane of formation of the metal layer M1 (X-Y plane in FIG. 2). However, the pattern shape of the internal wiring is not limited to the example shown in FIG. 2, but can be set arbitrarily within a range in which conditions such as a design rule and the like are satisfied, for example.

The DUT main body 10a further includes a first contact electrode 9a to a fourth contact electrode 9d. As shown in FIG. 3 and FIG. 4, each contact electrode is formed by vertical hole wiring (via), and is formed so as to penetrate through the first interlayer insulating film 11. Incidentally, the first contact electrode 9a to the fourth contact electrode 9d electrically connect the well region 1, the source region 2, the drain region 3, and the gate electrode 4 to the body wiring film 5, the source wiring film 6, the drain wiring film 7, and the gate wiring film 8, respectively.

Specifically, one end part (lower end part in FIG. 4) of the first contact electrode 9a is connected to substantially the center of the well connecting part 1a, and another end part (upper end part in FIG. 4) of the first contact electrode 9a is connected to one end part of the body wiring film 5. One end part (lower end part in FIG. 3) of the second contact electrode 9b is connected to substantially the center of the source region 2, and another end part (upper end part in FIG. 3) of the second contact electrode 9b is connected to one end part of the source wiring film 6. One end part of the third contact electrode 9c is connected to substantially the center of the drain region 3, and another end part of the third contact electrode 9c is connected to one end part of the drain wiring film 7. One end part of the fourth contact electrode 9d is connected to one part (lower end part in FIG. 2) of the gate electrode 4, and another end part of the fourth contact electrode 9d is connected to one end part of the gate wiring film 8.

Incidentally, in the present embodiment, description will be made of an example in which connection between each region or the gate electrode of the DUT main body 10a and the corresponding internal wiring (wiring film) is established by one contact electrode. However, the present disclosure is not limited to this. A plurality of contact electrodes may be provided between each region or the gate electrode of the DUT main body 10a and the corresponding internal wiring.

As shown in FIG. 3 and FIG. 4, each of the first to fourth connecting pins 13a to 13d is formed by vertical hole wiring (via), and electrically connects the corresponding internal wiring to the corresponding inter-DUT wiring.

Specifically, one end part (lower end part in FIG. 4) of the first connecting pin 13a is connected to another end part of the body wiring film 5 (which is on an opposite side from the side connected to the contact electrode). Another end part (upper end part in FIG. 4) of the first connecting pin 13a is connected to the first piece of inter-DUT wiring 21 for body terminals. One end part (lower end part in FIG. 3) of the second connecting pin 13b is connected to another end part of the source wiring film 6. Another end part (upper end part in FIG. 3) of the second connecting pin 13b is connected to the second piece of inter-DUT wiring 22 for source terminals. One end part of the third connecting pin 13c is connected to another end part of the drain wiring film 7. Another end part of the third connecting pin 13c is connected to the third piece of inter-DUT wiring 23 for drain terminals. One end part of the fourth connecting pin 13d is connected to another end part of the gate wiring film 8. Another end part of the fourth connecting pin 13d is connected to the fourth piece of inter-DUT wiring 24 for gate terminals.

[Arrangement of Connecting Pins and Operation of Rotating Test Structure]

In the DUT 10 according to the present embodiment, as shown in FIG. 2, the first to fourth connecting pins 13a to 13d are arranged at such positions as to be connected to the first to fourth pieces of inter-DUT wiring 21 to 24, respectively. That is, the first to fourth connecting pins 13a to 13d are arranged at such positions as to be superposed on the regions of formation of the first to fourth pieces of inter-DUT wiring 21 to 24, respectively, in the plane of pattern formation of the DUT 10 (in the X-Y plane in FIG. 2).

However, in the present embodiment, the first to fourth connecting pins 13a to 13d are arranged on a straight line L1 that passes through a center of rotation O (substantially the center of the gate electrode 4) in the plane of pattern formation of the DUT 10 and is inclined at 45 degrees to the extending direction of the inter-DUT wiring (X-axis direction in the example of FIG. 2). More specifically, for example, when an XY rectangular coordinate system (right-handed system) having the coordinates of the center of rotation O (position of the center of rotation) of the DUT 10 as an origin is set, the straight line L1 is represented by Y=−X, and the respective coordinates of the first to fourth connecting pins 13a to 13d are coordinates on the straight line L1 of Y=−X.

Figure 5:
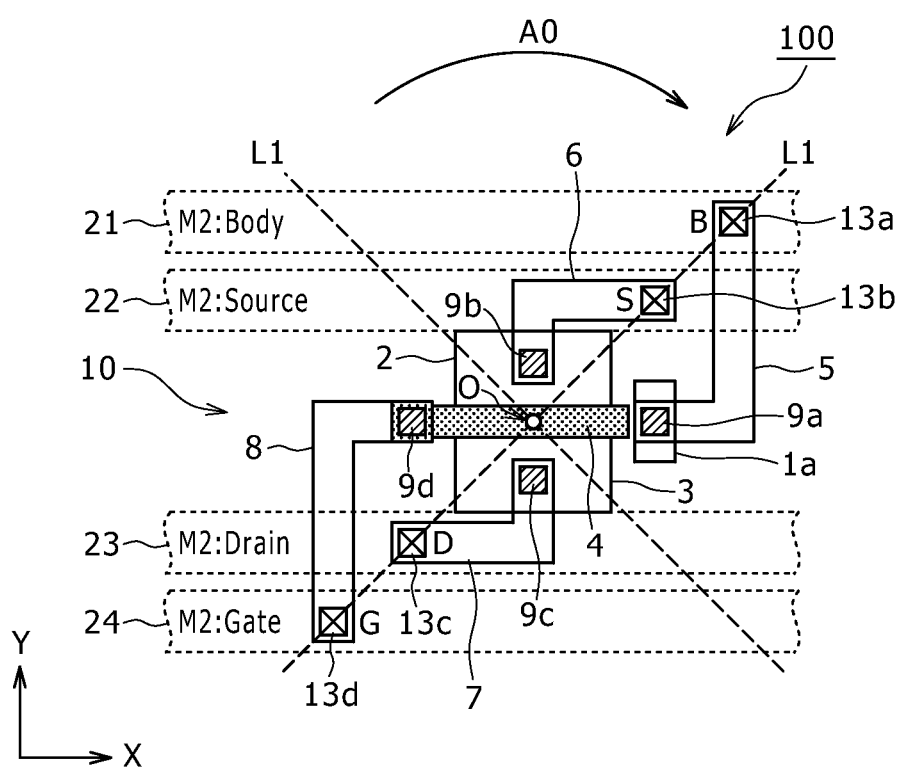
FIG. 5 is a schematic plan view of the test structure according to the first embodiment after the test structure is rotated by 90 degrees.

FIG. 5 shows a state when the pattern of the DUT 10 having the first to fourth connecting pins 13a to 13d of the above-described configuration is rotated about the center of rotation O by 90 degrees in a clockwise direction relative to the wiring section 20 from the basic state in the plane of pattern formation of the DUT 10. Incidentally, FIG. 5 is a diagram showing connection relation between the first to fourth connecting pins 13a to 13d of the DUT 10 and the first to fourth pieces of inter-DUT wiring 21 to 24 of the wiring section 20 after the rotation.

As is clear from FIG. 5, it is shown that the configuration according to the present embodiment can maintain the connection relation between the connecting pins and the pieces of inter-DUT wiring before the rotation even when the pattern of the DUT 10 is rotated by 90 degrees in the clockwise direction (direction of an arrow A0 in FIG. 5) relative to the wiring section 20.

The operation of rotating the cell data (pattern) of the DUT 10 as described above is performed when there is a need to rotate the test structure 100 by 90 degrees according to the extending direction of a scribe line on which the test structure 100 is disposed, for example. Specifically, as shown in FIG. 1, when the test structure 100 having a rectangular formation region extending in the X-axis direction is disposed on a scribe line extending in the X-axis direction, it suffices to dispose the test structure 100 as it is in the basic state without rotating the test structure 100. However, when the test structure 100 is disposed on a scribe line extending in the Y-axis direction, for example, the test structure 100 needs to be rotated by 90 degrees. The operation of rotating the DUT 10 as described above is performed at this time. The basic state and the state after the rotation are shown in FIGS. 6A and 6B.

FIG. 6A is a diagram showing the connection relation between the first to fourth connecting pins 13a to 13d of the DUT 10 and the first to fourth pieces of inter-DUT wiring 21 to 24 of the wiring section 20 in the basic state. FIG. 6B is a diagram showing the connection relation between the first to fourth connecting pins 13a to 13d of the DUT 10 and the first to fourth pieces of inter-DUT wiring 21 to 24 of the wiring section 20 after the rotation. Incidentally, FIGS. 6A and 6B do not show a detailed pattern of the DUT 10 to simplify description, but show the positions of the connecting pins and the center of rotation O of the DUT 10 and an outer frame defining the perimeter edge of the region of formation of the DUT 10 in the X-Y plane. However, the outer frame defining the perimeter edge of the region of formation of the DUT 10 is set by default by a layout design editor, for example.

When the test structure 100 is to be disposed on the scribe line extending in the Y-axis direction in FIG. 6A, the pattern of the DUT 10 in the design data is rotated by 90 degrees in the clockwise direction (direction of an arrow A1 in FIG. 6B) relative to the wiring section 20. In addition, at this time, the whole of the test structure 100 is rotated about the center of rotation O by 90 degrees in a counterclockwise direction (direction of an arrow A2 in FIG. 6B). As a result, after the rotation, the extending direction of the first to fourth pieces of inter-DUT wiring 21 to 24 is the Y-axis direction, but the connection relation between the connecting pins (B, S, D, and G in FIG. 6B) and the inter-DUT wiring is the same as that of the basic state (FIG. 6A).

That is, when the shape of the whole of the test structure 100 is changed from the horizontally long shape to the vertically long shape, the connection relation between the connecting pins and the pieces of inter-DUT wiring can be maintained by rotating the DUT 10 by 90 degrees in an opposite direction from the direction of rotation of the whole of the test structure 100. Incidentally, at this time, as is clear from comparison between FIG. 2 and FIG. 5, the configuration including the pattern of the various kinds of internal wiring, the positions of the various kinds of contact electrodes, and the like within the DUT 10 does not need to be corrected.

[Layout Design Method]

A layout design method (layout method) for the test structure 100 according to the present embodiment will next be described with reference to FIG. 7. FIG. 7 is a flowchart showing a concrete procedure of the layout design method for the test structure 100 according to the present embodiment.

First, an operator creates a layout design pattern (layout pattern) for the DUT 10 using a layout design editor (step S1). Specifically, the operator creates a layout design pattern for the source region, the drain region, the well connecting part, the gate electrode, each contact electrode, each piece of internal wiring, and each connecting pin of the DUT 10 using the layout design editor. At this time, as shown in FIG. 2, each connecting pin is disposed such that the coordinates of the first to fourth connecting pins 13a to 13d are coordinates on the straight line L1 represented by Y=−X in the XY rectangular coordinate system (whose origin is the center of rotation O of the DUT 10) in the plane of pattern formation of the DUT 10.

Next, the operator creates a layout design pattern (layout pattern) for the various kinds of inter-DUT wiring (wiring section 20) as the higher-level layer than the cell data of the DUT 10 using the layout design editor (step S2). At this time, in the present embodiment, the layout design pattern for each piece of inter-DUT wiring is created such that the extending direction of each piece of inter-DUT wiring is a direction (X-axis direction in FIG. 2) orthogonal to the gate direction of the DUT 10.

As a result of the above-described steps S1 and S2, the layout design pattern for the basic state of the test structure 100 is created. Incidentally, in the present embodiment, the design operation of step S2 may be performed before the design operation of step S1.

Next, when disposing the test structure 100 in a predetermined region (for example on a scribe line) on a wafer, the operator for example determines whether the gate direction of the DUT 10 is a desired direction on the layout design editor (step S3). Specifically, in the present embodiment, at this time, the operator for example determines whether the gate direction of the DUT 10 is the Y-axis direction in FIG. 2 on the layout design editor.

In step S3, when the test structure 100 is disposed on a scribe line extending in the X-axis direction, for example, the gate direction is the desired direction (Y-axis direction), and therefore a result of determination in step S3 is YES. In this case, it suffices to dispose the test structure 100 in the basic state. Therefore, the operator for example disposes the test structure 100 in a predetermined position without rotating the cell data of the DUT 10 (step S4).

On the other hand, in step S3, when the test structure 100 is disposed on a scribe line extending in the Y-axis direction, for example, the whole of the test structure 100 is rotated by 90 degrees. In this case, the gate direction is the direction (X-axis direction) orthogonal to the desired direction (Y-axis direction), and therefore a result of determination in step S3 is NO. Therefore, in this case, the operator for example sets the gate direction to the desired direction by rotating only the cell data of the DUT 10 by 90 degrees in an opposite direction from the direction of rotation of the whole of the test structure 100 (step S5). However, at this time, in the present embodiment (examples shown in FIG. 2 and FIG. 5), the cell data of the DUT 10 is rotated by 90 degrees in the clockwise direction relative to the wiring section 20.

Incidentally, when Virtuoso manufactured by Cadence, for example, is used as the layout design editor, the above-described operation of rotating the DUT 10 can be realized by operating rotation information of a DUT instance (or a DUT cell) on the layout design editor. In addition, as another method for the operation of rotating the DUT 10, a method of directly operating angle information of the DUT 10 included in quoted information of the DUT 10, for example, may be used in the layer of the wiring section 20.

In the present embodiment, the layout design pattern of the test structure 100 is created as described above. Incidentally, an example in which the operator performs various kinds of operation has been described in the description of the operation in the above step S3 and subsequent steps. However, the present disclosure is not limited to this. For example, the layout design editor may automatically perform the operation in the above step S3 and subsequent steps by using a program included within the layout design editor itself.

Comparative Example

Figure 8:
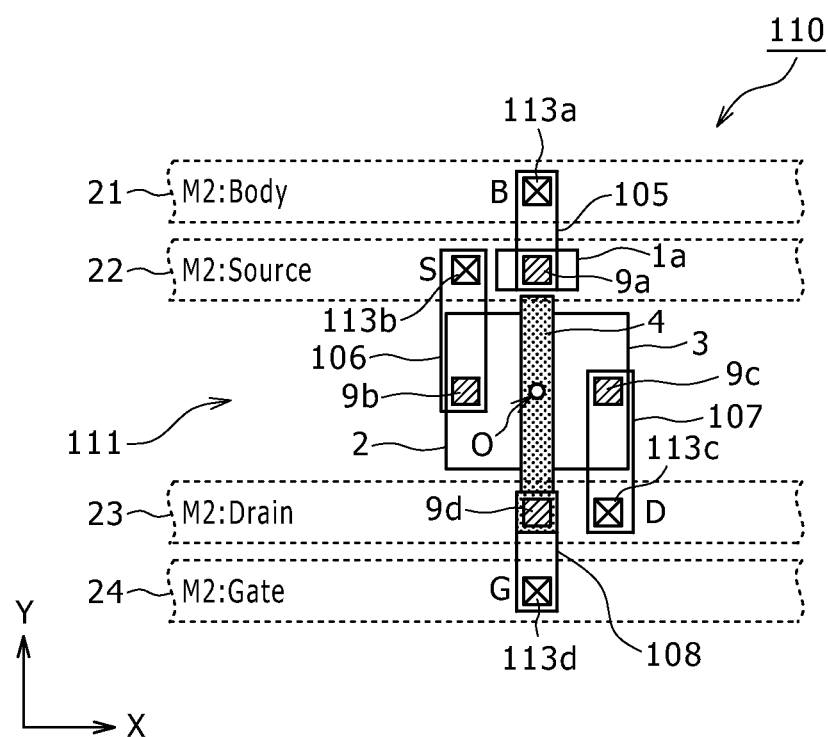
FIG. 8 is a schematic plan view of a test structure according to a comparative example.

FIG. 8 shows an example (comparative example) of configuration of a test structure to which the arrangement and configuration of the connecting pins of the DUT 10 according to the present embodiment are not applied for comparison. Incidentally, in the test structure 110 according to the comparative example shown in FIG. 8, constituent elements similar to those of the test structure 100 according to the present embodiment shown in FIG. 2 are identified by the same references. In the comparative example, a DUT 111 is a MOS transistor.

As is clear from comparison between FIG. 8 and FIG. 2, the shape of each piece of internal wiring and the arrangement position of each connecting pin of the DUT 111 according to the comparative example are different from those of the DUT 10 according to the present embodiment. The other configuration of the test structure 110 is similar to the corresponding configuration of the test structure 100 according to the present embodiment.

In the DUT 111 according to the comparative example, a body wiring film 105, a source wiring film 106, a drain wiring film 107, and a gate wiring film 108 are formed by a metallic film extending in the shape of a straight line in a plane of formation of a metal layer M1. Then, each connecting pin is disposed such that the coordinates of a first to a fourth connecting pins 113a to 113d are not coordinates on the straight line L1 represented by Y=−X in an XY rectangular coordinate system (whose origin is the center of rotation O of the DUT 111) in the plane of pattern formation of the DUT 111. Incidentally, in a design method in the past, the shape of each piece of internal wiring and the arrangement position of each connecting pin of the DUT are set arbitrarily within a range in which conditions such as a DUT formation space, a design rule, and the like are satisfied, for example.

Though not shown, the configuration according to the comparative example cannot maintain connection relation between the connecting pins and inter-DUT wiring in a basic state after rotation when the pattern of the DUT 111 is rotated by 90 degrees relative to a wiring section 20. Therefore, in the comparative example, when the test structure 110 needs to be rotated by 90 degrees according to the extending direction of a scribe line, for example, the configuration including the shape of each piece of internal wiring, the arrangement position of each connecting pin, and the like of the DUT 111 needs to be corrected as appropriate.

On the other hand, in the test structure 100 according to the present embodiment, when the test structure 100 needs to be rotated by 90 degrees, provision can be made by merely rotating the pattern of the DUT 10 by 90 degrees relative to the wiring section 20, as described above. In addition, at this time, the present embodiment can maintain the connection relation between the connecting pins and the pieces of inter-DUT wiring in the basic state even after the rotation without correcting (changing) the pattern of the various kinds of internal wiring within the DUT 10 and the various kinds of inter-DUT wiring of the wiring section 20 before the rotation. Therefore, the present embodiment makes it possible to design the test structure 100 more easily than the comparative example.

In addition, in the test structure 100 according to the present embodiment, the direction of arrangement of the DUT 10 (vertical or horizontal direction) can be set by merely operating the rotation information within the quoted information of the DUT 10, as described above. Therefore, when design techniques for the test structure 100 according to the present embodiment are used, a layout design system can be constructed in which the direction of arrangement of the DUT 10 can be selected easily while the connection relation between the DUT 10 and the inter-DUT wiring at the higher level than the DUT 10 is maintained.

Incidentally, in the case in which the connecting pins are formed by an L-shaped routing structure as in the design method proposed in the above-described Patent Document 1, the pattern of the internal wiring of the DUT and the inter-DUT wiring does not need to be corrected even when the whole of the test structure is rotated by 90 degrees. However, the design method for the test structure 100 in the present embodiment has the following advantages over the design method proposed in the above-described Patent Document 1.

The design method of the above-described Patent Document 1 requires that two L-shaped connecting pins be formed at such positions as to be opposed to each other with the center of rotation of the DUT interposed between the connecting pins. The design method of the above-described Patent Document 1 therefore imposes great limitations on layout, and provides a small degree of freedom of design.

On the other hand, in the present embodiment, it suffices to dispose each connecting pin such that the coordinates of the first to fourth connecting pins 13a to 13d are coordinates on the straight line L1 represented by Y=−X in the XY rectangular coordinate system (whose origin is the center of rotation O of the DUT 10) in the plane of pattern formation of the DUT 10. The other configuration of the layout design pattern of the test structure 100 can be set arbitrarily within a range in which conditions such as a design rule and the like are satisfied, for example. Therefore, as compared with the method of Patent Document 1, the present embodiment imposes less limitation on layout, and provides a larger degree of freedom of design.

In addition, the design method of Patent Document 1 allows only two L-shaped connecting pins, at most, to be formed in one metallic wiring layer. That is, when three or more connecting pins need to be provided for one DUT (four connecting pins are necessary for a MOS transistor), two or more metallic wiring layers need to be provided for one DUT.

On the other hand, the design method according to the present embodiment allows all connecting pins to be formed in one layer, as described above. In addition, the present embodiment allows the pattern shape of each piece of internal wiring to be set arbitrarily. Further, the present embodiment allows all pieces of internal wiring to be formed in one metallic wiring layer (M1), and enables effective use of the inter-DUT wiring.

2. Second Embodiment

Configuration of Test Structure

FIG. 9 shows a schematic configuration of a test structure according to a second embodiment of the present disclosure. FIG. 9 is a schematic plan view of a layout design pattern of a DUT and various kinds of inter-DUT wiring in a basic state (before rotation) in the test structure 120 according to the second embodiment. Incidentally, in the test structure 120 according to the second embodiment shown in FIG. 9, constituent elements similar to those of the test structure 100 according to the first embodiment shown in FIG. 2 are identified by the same references.

Though not shown, as in the foregoing first embodiment, the test structure 120 according to the present embodiment includes a plurality of DUTs 30, a plurality of test electrode pads, and a wiring section having a plurality of pieces of inter-DUT wiring for respectively establishing connection between the plurality of test electrode pads and each DUT 30. In addition, though not shown, the test structure 120 has a semiconductor substrate (substrate). The DUTs 30, the test electrode pads, and the wiring section are formed on the semiconductor substrate. Incidentally, a DUT main body in the test structure 120 according to the present embodiment is formed by a MOS transistor. Thus, as in the foregoing first embodiment, the wiring section includes four pieces of inter-DUT wiring (a first piece of inter-DUT wiring 41 to a fourth piece of inter-DUT wiring 44).

However, as is clear from comparison between FIG. 9 and FIG. 2, the arrangement position of the second inter-DUT wiring for source terminals and the arrangement position of the third inter-DUT wiring for drain terminals in the foregoing first embodiment are interchanged with each other in the present embodiment. That is, in the present embodiment, the second piece of inter-DUT wiring 42 is a piece of inter-DUT wiring for drain terminals, and the third piece of inter-DUT wiring 43 is a piece of inter-DUT wiring for source terminals. The configuration of the other pieces of inter-DUT wiring is similar to the corresponding configuration of the foregoing first embodiment.

In addition, as is clear from comparison between FIG. 9 and FIG. 2, configuration including the arrangement position of each connecting pin, the shape of each piece of internal wiring, and the like of the DUT 30 according to the present embodiment is different from that of the DUT 10 according to the foregoing first embodiment. The other configuration of the DUT 30 is similar to the corresponding configuration of the DUT 10 according to the foregoing first embodiment.

In the present embodiment, a first connecting pin 33a, a second connecting pin 33b, a third connecting pin 33c, and a fourth connecting pin 33d are disposed at such positions as to be connected to the first piece of inter-DUT wiring 41, the third piece of inter-DUT wiring 43, the second piece of inter-DUT wiring 42, and the fourth piece of inter-DUT wiring 44, respectively. That is, the first connecting pin 33a, the third connecting pin 33c, the second connecting pin 33b, and the fourth connecting pin 33d are disposed in such positions as to be superposed on regions of formation of the first to fourth pieces of inter-DUT wiring 41 to 44, respectively, in a plane of pattern formation of the DUT 30 (in an X-Y plane in FIG. 9).

Further, in the present embodiment, the first to fourth connecting pins 33a to 33d are arranged on a straight line L2 that passes through a center of rotation O (substantially the center of the gate electrode 4) in the plane of pattern formation of the DUT 30 and is inclined at 45 degrees to the extending direction of the inter-DUT wiring (X-axis direction in FIG. 9). However, in the present embodiment, the direction of inclination of the straight line L2 with respect to a Y-axis direction in FIG. 9 is opposite to the direction of inclination of the straight line L1 in the foregoing first embodiment. More specifically, for example, when an XY rectangular coordinate system (right-handed system) having the coordinates of the center of rotation O of the DUT 30 as an origin is set, the straight line L2 is represented by Y=X, and the respective coordinates of the first to fourth connecting pins 33a to 33d are coordinates on the straight line L2 of Y=X.

In addition, in the present embodiment, a body wiring film 35, a source wiring film 36, a drain wiring film 37, and a gate wiring film 38 are each formed in a metal layer M1, and are formed by a metallic film extending in substantially the shape of an L in a plane of formation of the metal layer M1.

In the present embodiment, however, the pattern of each piece of internal wiring is changed as the positions of the respective connecting pins are changed as described above. Specifically, the L-shaped patterns of the body wiring film 35 and the gate wiring film 38 according to the present embodiment and the L-shaped patterns of the body wiring film 5 and the gate wiring film 8 according to the foregoing first embodiment are respectively axisymmetric with respect to the Y-axis direction in FIG. 9. In addition, the L-shaped patterns of the source wiring film 36 and the drain wiring film 37 according to the present embodiment and the L-shaped patterns of the source wiring film 6 and the drain wiring film 7 according to the foregoing first embodiment are respectively axisymmetric with respect to the X-axis direction in FIG. 9.

Incidentally, the test structure 120 according to the present embodiment having the above-described configuration can be designed by a similar procedure to the design procedure for the test structure 100 as described above in the foregoing first embodiment (FIG. 7).

[Operation of Rotating Test Structure]

When the pattern of the DUT 30 is rotated by 90 degrees in a counterclockwise direction relative to the wiring section, even after the rotation, the test structure 120 according to the present embodiment can maintain connection relation between the connecting pins and the pieces of inter-DUT wiring before the rotation. An example of the rotating operation is shown in FIGS. 10A and 10B.

FIG. 10A is a diagram showing the connection relation between the first to fourth connecting pins 33a to 33d of the DUT 30 and the first to fourth pieces of inter-DUT wiring 41 to 44 of the wiring section in the basic state. FIG. 10B is a diagram showing the connection relation between the first to fourth connecting pins 33a to 33d of the DUT 30 and the first to fourth pieces of inter-DUT wiring 41 to 44 of the wiring section after the rotation. Incidentally, FIGS. 10A and 10B do not show a detailed pattern of the DUT 30 to simplify description, but show the positions of the connecting pins and the center of rotation O of the DUT 30 and an outer frame defining the perimeter edge of a region of formation of the DUT 30 in the X-Y plane.

Incidentally, the rotating operation shown in FIGS. 10A and 10B is performed when there is a need to rotate the whole of the test structure 120 by 90 degrees according to the extending direction of a scribe line on which the test structure 120 is disposed, for example.

When the test structure 120 according to the present embodiment is rotated by 90 degrees from the basic state (FIG. 10A), the pattern of the DUT 30 in design data is rotated by 90 degrees in a counterclockwise direction (direction of an arrow A3 in FIG. 10B) relative to the wiring section. In addition, at this time, the whole of the test structure 120 is rotated about the center of rotation O by 90 degrees in a clockwise direction (direction of an arrow A4 in FIG. 10B). As a result, after the rotation, the extending direction of the first to fourth pieces of inter-DUT wiring 41 to 44 is the Y-axis direction, but the connection relation between the connecting pins (B, S, D, and G in FIG. 10B) and the inter-DUT wiring is the same as that of the basic state (FIG. 10A).

That is, also in the present embodiment, when the test structure 120 is rotated by 90 degrees, the connection relation between the connecting pins and the pieces of inter-DUT wiring can be maintained by rotating the DUT 30 by 90 degrees in an opposite direction from the direction of rotation of the whole of the test structure 120. In addition, at this time, also in the present embodiment, the configuration including the pattern of the various kinds of internal wiring, the positions of the various kinds of contact electrodes, and the like within the DUT 30 does not need to be changed. Therefore, also in the present embodiment, the test structure 120 can be designed more easily, and similar effects to those of the foregoing first embodiment can be obtained.

3. Third Embodiment

In the foregoing first and second embodiments, description has been made of an example in which the extending direction of the inter-DUT wiring is orthogonal to the gate direction in the basic state of the test structure. However, the present disclosure is not limited to this. Test structure designing techniques according to an embodiment of the present disclosure are also applicable to cases in which the extending direction of inter-DUT wiring is parallel with a gate direction in the basic state of a test structure. An example of such a case will be described in a third embodiment.

[Configuration of Test Structure]

Figure 11:
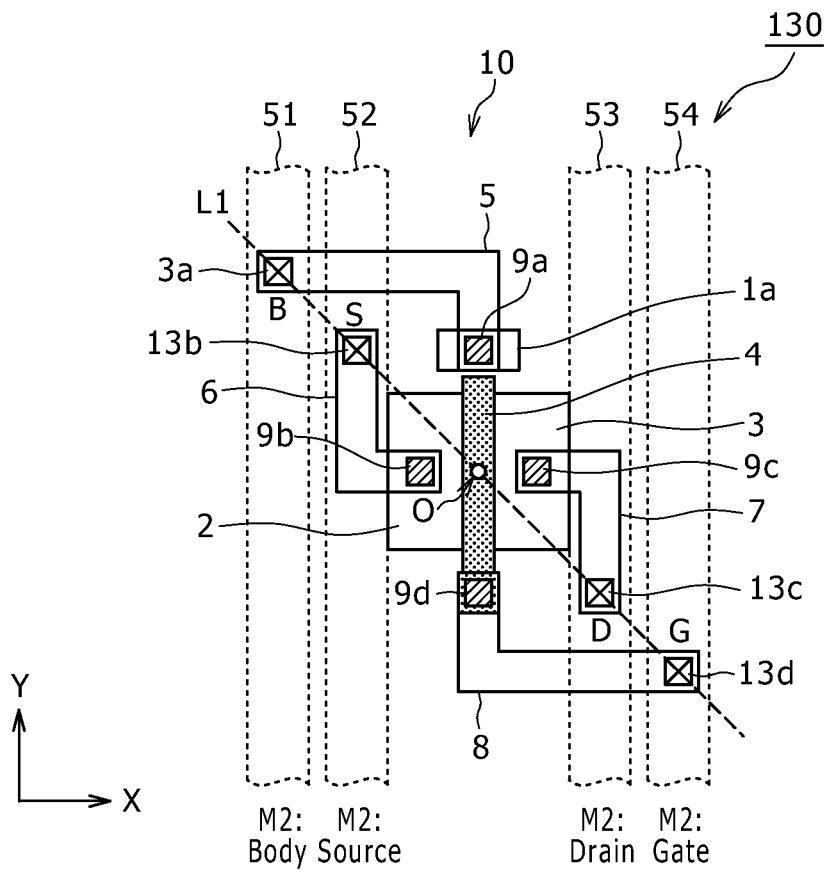
FIG. 11 is a schematic plan view of a test structure according to a third embodiment.

FIG. 11 shows a schematic configuration of a test structure according to a third embodiment of the present disclosure. FIG. 11 is a schematic plan view of a layout design pattern of a DUT and various kinds of inter-DUT wiring in a basic state (before rotation) in the test structure 130 according to the third embodiment. Incidentally, in the test structure 130 according to the present embodiment shown in FIG. 11, constituent elements similar to those of the test structure 100 according to the first embodiment shown in FIG. 2 are identified by the same references.

Though not shown, as in the foregoing first embodiment, the test structure 130 according to the present embodiment includes a plurality of DUTs 10, a plurality of test electrode pads, and a wiring section having a plurality of pieces of inter-DUT wiring for respectively establishing connection between the plurality of test electrode pads and each DUT 10. In addition, though not shown, the test structure 130 has a semiconductor substrate (substrate). The DUTs 10, the test electrode pads, and the wiring section are formed on the semiconductor substrate. Incidentally, a DUT main body in the test structure 130 according to the present embodiment is formed by a MOS transistor. Thus, as in the foregoing first embodiment, the wiring section includes four pieces of inter-DUT wiring (a first piece of inter-DUT wiring 51 to a fourth piece of inter-DUT wiring 54).

In addition, as is clear from comparison between FIG. 11 and FIG. 2, the test structure 130 according to the present embodiment has a configuration formed by making the extending direction of each piece of inter-DUT wiring parallel with the extending direction (Y-axis direction) of the gate electrode 4 of the DUT 10 in the test structure 100 according to the foregoing first embodiment. The other configuration of the test structure 130 is similar to the corresponding configuration of the foregoing first embodiment.

However, also in the present embodiment, as shown in FIG. 11, a first to a fourth connecting pin 13a to 13d are disposed at such positions as to be connected to the first to fourth pieces of inter-DUT wiring 51 to 54, respectively. That is, the first to fourth connecting pins 13a to 13d are disposed in such positions as to be superposed on regions of formation of the first to fourth pieces of inter-DUT wiring 51 to 54, respectively, in a plane of pattern formation of the DUT 10 (in an X-Y plane in FIG. 11).

Further, in the present embodiment, the first to fourth connecting pins 13a to 13d are arranged on a straight line L1 that passes through a center of rotation O (substantially the center of a gate electrode 4) in the plane of pattern formation of the DUT 10 and is inclined at 45 degrees to the extending direction of the inter-DUT wiring (Y-axis direction in FIG. 11). That is, in the present embodiment, as in the foregoing first embodiment, each connecting pin is disposed such that the respective coordinates of the first to fourth connecting pins 13a to 13d are coordinates on the straight line L1 represented by Y=−X in an XY rectangular coordinate system having the coordinates of the center of rotation O of the DUT 10 as an origin.

Incidentally, the test structure 130 according to the present embodiment having the above-described configuration can be designed by a similar procedure to the design procedure for the test structure 100 as described above in the foregoing first embodiment (FIG. 7).

[Operation of Rotating Test Structure]

When the pattern of the DUT 10 is rotated by 90 degrees in a counterclockwise direction relative to the wiring section, even after the rotation, the test structure 130 according to the present embodiment can maintain connection relation between the connecting pins and the pieces of inter-DUT wiring before the rotation. An example of the rotating operation is shown in FIGS. 12A and 12B.

Figure 12A:
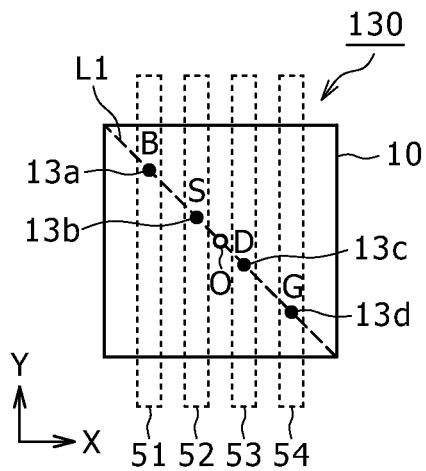
FIGS. 12A and 12B are diagrams of assistance in explaining an example of an operation of rotating the test structure according to the third embodiment.

FIG. 12A is a diagram showing the connection relation between the first to fourth connecting pins 13a to 13d of the DUT 10 and the first to fourth pieces of inter-DUT wiring 51 to 54 of the wiring section in the basic state. FIG. 12B is a diagram showing the connection relation between the first to fourth connecting pins 13a to 13d of the DUT 10 and the first to fourth pieces of inter-DUT wiring 51 to 54 of the wiring section after the rotation. Incidentally, FIGS. 12A and 12B do not show a detailed pattern of the DUT 10 to simplify description, but show the positions of the connecting pins and the center of rotation O of the DUT 10 and an outer frame defining the perimeter edge of a region of formation of the DUT 10 in the X-Y plane.

Figure 12B:
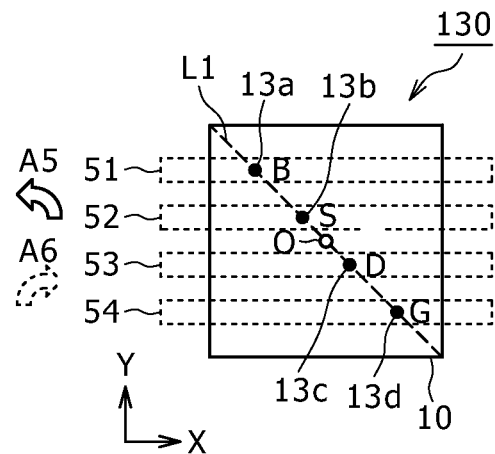

Incidentally, the rotating operation shown in FIGS. 12A and 12B is performed when there is a need to rotate the whole of the test structure 130 by 90 degrees according to the extending direction of a scribe line on which the test structure 130 is disposed, for example.

When the test structure 130 according to the present embodiment is rotated by 90 degrees from the basic state (FIG. 12A), the pattern of the DUT 10 in design data is rotated by 90 degrees in a counterclockwise direction (direction of an arrow A5 in FIG. 12B) relative to the wiring section. In addition, at this time, the whole of the test structure 130 is rotated about the center of rotation O by 90 degrees in a clockwise direction (direction of an arrow A6 in FIG. 12B). As a result, after the rotation, the extending direction of the first to fourth pieces of inter-DUT wiring 51 to 54 is the X-axis direction, but the connection relation between the connecting pins (B, S, D, and G in FIG. 12B) and the inter-DUT wiring is the same as that of the basic state (FIG. 12A).

That is, also in the present embodiment, when the test structure 130 is rotated by 90 degrees, the connection relation between the connecting pins and the pieces of inter-DUT wiring can be maintained by rotating the DUT 10 by 90 degrees in an opposite direction from the direction of rotation of the whole of the test structure 130. In addition, at this time, also in the present embodiment, the configuration including the pattern of the various kinds of internal wiring, the positions of the various kinds of contact electrodes, and the like within the DUT 10 does not need to be changed. Therefore, also in the present embodiment, the test structure 130 can be designed more easily, and similar effects to those of the foregoing first embodiment can be obtained.

4. Fourth Embodiment

In the foregoing third embodiment, description has been made of an example in which the extending direction of the inter-DUT wiring is parallel with the gate direction in the test structure 100 according to the foregoing first embodiment. However, the present disclosure is not limited to this. For example, the extending direction of the inter-DUT wiring may be made parallel with the gate direction in the test structure 120 according to the foregoing second embodiment. An example of such a case will be described in a fourth embodiment.

[Configuration of Test Structure]

Figure 13:
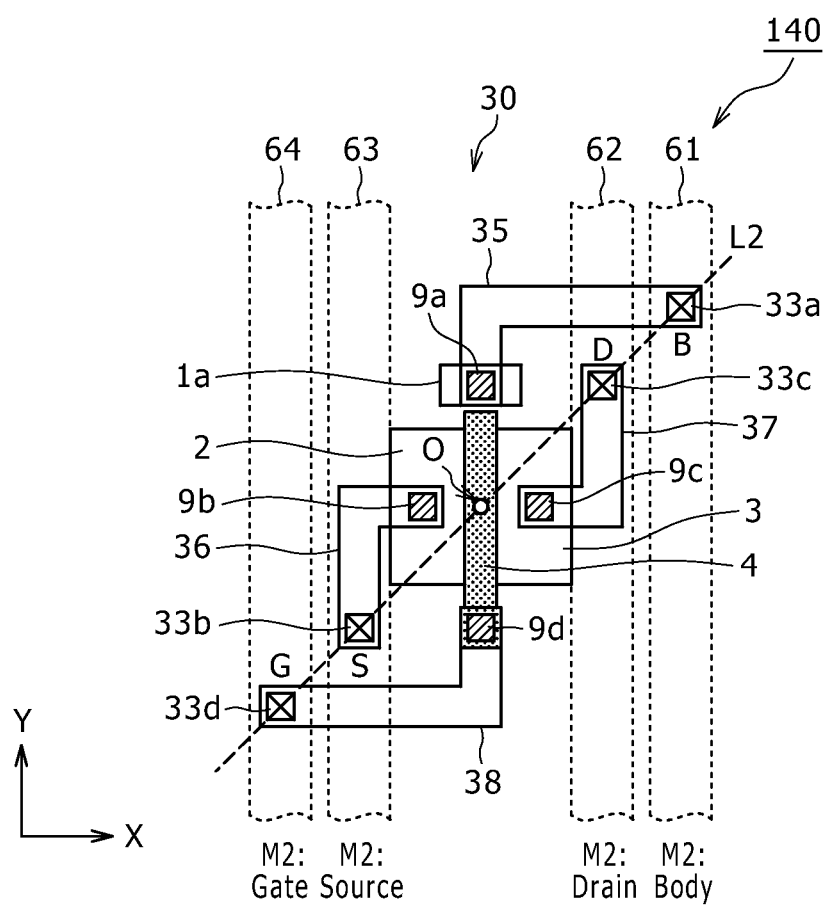
FIG. 13 is a schematic plan view of a test structure according to a fourth embodiment.

FIG. 13 shows a schematic configuration of a test structure according to a fourth embodiment of the present disclosure. FIG. 13 is a schematic plan view of a layout design pattern of a DUT and various kinds of inter-DUT wiring in a basic state (before rotation) in the test structure 140 according to the fourth embodiment. Incidentally, in the test structure 140 according to the present embodiment shown in FIG. 13, constituent elements similar to those of the test structure 120 according to the second embodiment shown in FIG. 9 are identified by the same references.

Though not shown, as in the foregoing first embodiment, the test structure 140 according to the present embodiment includes a plurality of DUTs 30, a plurality of test electrode pads, and a wiring section having a plurality of pieces of inter-DUT wiring for respectively establishing connection between the plurality of test electrode pads and each DUT 30. In addition, though not shown, the test structure 140 has a semiconductor substrate (substrate). The DUTs 30, the test electrode pads, and the wiring section are formed on the semiconductor substrate. Incidentally, a DUT main body in the test structure 140 according to the present embodiment is formed by a MOS transistor. Thus, as in the foregoing first embodiment, the wiring section includes four pieces of inter-DUT wiring (a first piece of inter-DUT wiring 61 to a fourth piece of inter-DUT wiring 64).

In addition, as is clear from comparison between FIG. 13 and FIG. 9, the test structure 140 according to the present embodiment has a configuration formed by making the extending direction of each piece of inter-DUT wiring parallel with the gate direction (Y-axis direction) of the DUT 30 in the test structure 120 according to the foregoing second embodiment. The other configuration of the test structure 140 is similar to the corresponding configuration of the foregoing second embodiment.

However, also in the present embodiment, as shown in FIG. 13, a first connecting pin 33a, a third connecting pin 33c, a second connecting pin 33b, and a fourth connecting pin 33d are disposed at such positions as to be connected to the first to fourth pieces of inter-DUT wiring 61 to 64, respectively. That is, the first connecting pin 33a, the third connecting pin 33c, the second connecting pin 33b, and the fourth connecting pin 33d are disposed in such positions as to be superposed on regions of formation of the first to fourth pieces of inter-DUT wiring 61 to 64, respectively, in an X-Y plane in FIG. 13.

Further, in the present embodiment, the first to fourth connecting pins 33a to 33d are arranged on a straight line L2 that passes through a center of rotation O (substantially the center of a gate electrode 4) in the plane of pattern formation of the DUT 30 and is inclined at 45 degrees to the extending direction of the inter-DUT wiring (Y-axis direction in FIG. 13). That is, in the present embodiment, as in the foregoing second embodiment, each connecting pin is disposed such that the respective coordinates of the first to fourth connecting pins 33a to 33d are coordinates on the straight line L2 represented by Y=X in an XY rectangular coordinate system having the coordinates of the center of rotation O of the DUT 30 as an origin.

Incidentally, the test structure 140 according to the present embodiment having the above-described configuration can be designed by a similar procedure to the design procedure for the test structure 100 as described above in the foregoing first embodiment (FIG. 7).

[Operation of Rotating Test Structure]

When the pattern of the DUT 30 is rotated by 90 degrees in a clockwise direction relative to the wiring section, even after the rotation, the test structure 140 according to the present embodiment can maintain connection relation between the connecting pins and the pieces of inter-DUT wiring before the rotation. An example of the rotating operation is shown in FIGS. 14A and 14B.

Figure 14A:
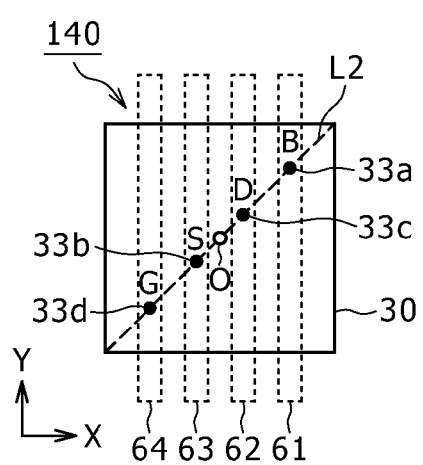
FIGS. 14A and 14B are diagrams of assistance in explaining an example of an operation of rotating the test structure according to the fourth embodiment.

FIG. 14A is a diagram showing the connection relation between the first to fourth connecting pins 33a to 33d of the DUT 30 and the first to fourth pieces of inter-DUT wiring 61 to 64 of the wiring section in the basic state. FIG. 14B is a diagram showing the connection relation between the first to fourth connecting pins 33a to 33d of the DUT 30 and the first to fourth pieces of inter-DUT wiring 61 to 64 of the wiring section after the rotation. Incidentally, FIGS. 14A and 14B do not show a detailed pattern of the DUT 30 to simplify description, but show the positions of the connecting pins and the center of rotation O of the DUT 30 and an outer frame defining the perimeter edge of a region of formation of the DUT 30 in the X-Y plane.

Figure 14B:
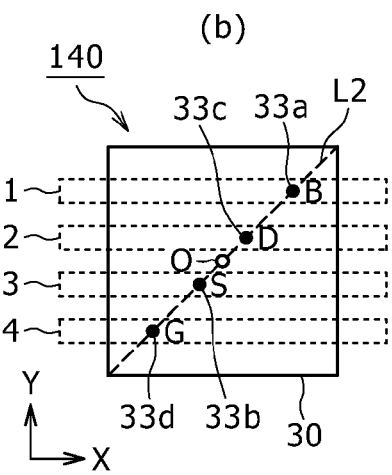

Incidentally, the rotating operation shown in FIGS. 14A and 14B is performed when there is a need to rotate the whole of the test structure 140 by 90 degrees according to the extending direction of a scribe line on which the test structure 140 is disposed, for example.

When the test structure 140 according to the present embodiment is rotated by 90 degrees from the basic state (FIG. 14A), the pattern of the DUT 30 in design data is rotated by 90 degrees in a clockwise direction (direction of an arrow A7 in FIG. 14B) relative to the wiring section. In addition, at this time, the whole of the test structure 140 is rotated about the center of rotation O by 90 degrees in a counterclockwise direction (direction of an arrow A8 in FIG. 14B). As a result, after the rotation, the extending direction of the first to fourth pieces of inter-DUT wiring 61 to 64 is the X-axis direction, but the connection relation between the connecting pins (B, S, D, and G in FIG. 14B) and the inter-DUT wiring is the same as that of the basic state (FIG. 14A).

That is, also in the present embodiment, when the test structure 140 is rotated by 90 degrees, the connection relation between the connecting pins and the pieces of inter-DUT wiring can be maintained by rotating the DUT 30 by 90 degrees in an opposite direction from the direction of rotation of the whole of the test structure 140. In addition, at this time, also in the present embodiment, the configuration including the pattern of the various kinds of internal wiring, the positions of the various kinds of contact electrodes, and the like within the DUT 30 does not need to be changed. Therefore, also in the present embodiment, the test structure 140 can be designed more easily, and similar effects to those of the foregoing first embodiment can be obtained.

5. Fifth Embodiment

In the foregoing first to fourth embodiments, description has been made of examples of configuration of test structures in which all of a plurality of pieces of inter-DUT wiring extend in the same direction. However, the present disclosure is not limited to this. For example, the extending direction of a part of the plurality of pieces of inter-DUT wiring and the extending direction of the other pieces of inter-DUT wiring may be orthogonal to each other. An example of such a case will be described in a fifth embodiment.

[Configuration of Test Structure]

Figure 15:
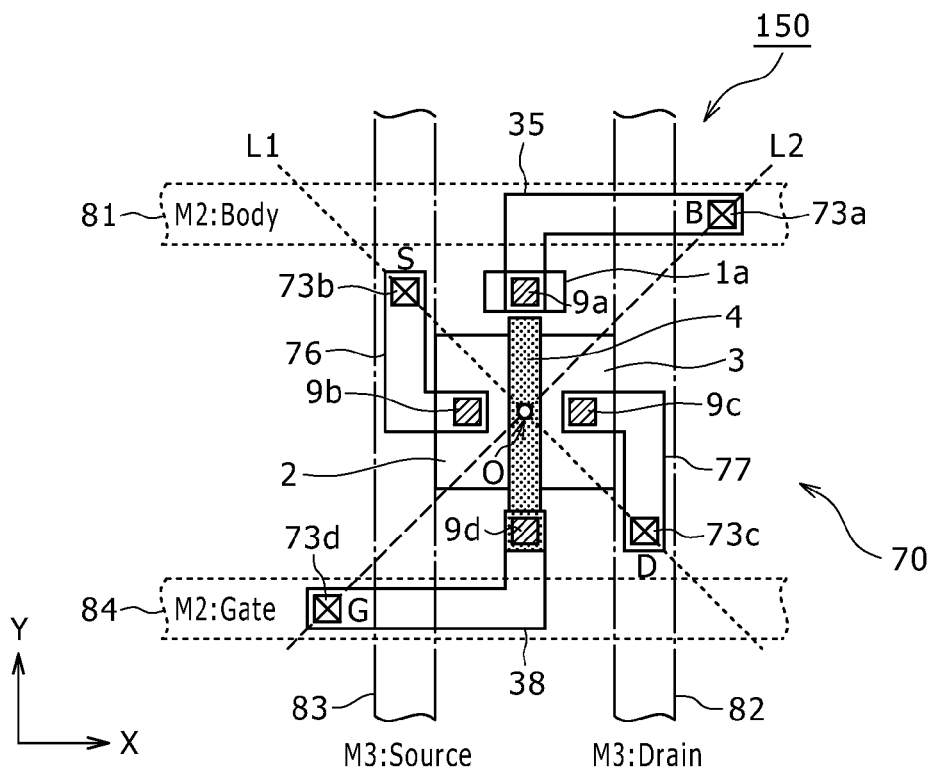
FIG. 15 is a schematic plan view of a test structure according to a fifth embodiment.

FIG. 15 shows a schematic configuration of a test structure according to a fifth embodiment of the present disclosure. FIG. 15 is a schematic plan view of a layout design pattern of a DUT and various kinds of inter-DUT wiring in a basic state (before rotation) in the test structure 150 according to the fifth embodiment. Incidentally, in the test structure 150 according to the present embodiment shown in FIG. 15, constituent elements similar to those of the test structure 120 according to the second embodiment shown in FIG. 9 are identified by the same references.

Though not shown, as in the foregoing first embodiment, the test structure 150 according to the present embodiment includes a plurality of DUTs 70, a plurality of test electrode pads, and a wiring section having a plurality of pieces of inter-DUT wiring for respectively establishing connection between the plurality of test electrode pads and each DUT 70. In addition, though not shown, the test structure 150 has a semiconductor substrate (substrate). The DUTs 70, the test electrode pads, and the wiring section are formed on the semiconductor substrate. Incidentally, a DUT main body in the test structure 150 according to the present embodiment is formed by a MOS transistor. Thus, as in the foregoing first embodiment, the wiring section includes four pieces of inter-DUT wiring (a first piece of inter-DUT wiring 81 to a fourth piece of inter-DUT wiring 84).

In the present embodiment, the extending direction of the first piece of inter-DUT wiring 81 for body terminals and the fourth piece of inter-DUT wiring 84 for gate terminals (first wiring) is an X-axis direction in FIG. 15 as in the foregoing second embodiment. However, the extending direction of the second piece of inter-DUT wiring 82 for drain terminals and the third piece of inter-DUT wiring 83 for source terminals (second wiring) is a Y-axis direction in FIG. 15. That is, in the present embodiment, the extending direction of the second piece of inter-DUT wiring 82 for drain terminals and the third piece of inter-DUT wiring 83 for source terminals is made orthogonal to the extending direction of the first piece of inter-DUT wiring 81 for body terminals and the fourth piece of inter-DUT wiring 84 for gate terminals.

In addition, in the present embodiment, the first piece of inter-DUT wiring 81 for body terminals and the fourth piece of inter-DUT wiring 84 for gate terminals are formed in a metal layer M2 as in the foregoing second embodiment. On the other hand, the second piece of inter-DUT wiring 82 for drain terminals and the third piece of inter-DUT wiring 83 for source terminals are formed in a metal layer M3 formed over the metal layer M2 with an interlayer insulating film not shown interposed between the metal layer M2 and the metal layer M3. Incidentally, the configuration of each piece of inter-DUT wiring other than the above configuration is similar to that of the foregoing second embodiment.

In addition, as is clear from comparison between FIG. 15 and FIG. 9, configuration including the arrangement position of each connecting pin, the shape of each piece of internal wiring, and the like of the DUT 70 according to the present embodiment is different from that of the DUT 30 according to the foregoing second embodiment. The other configuration of the DUT 70 is similar to the corresponding configuration of the DUT 30 according to the foregoing second embodiment.

In the present embodiment, a first connecting pin 73a, a second connecting pin 73b, a third connecting pin 73c, and a fourth connecting pin 73d are disposed at such positions as to be connected to the first piece of inter-DUT wiring 81, the third piece of inter-DUT wiring 83, the second piece of inter-DUT wiring 82, and the fourth piece of inter-DUT wiring 84, respectively. That is, the first connecting pin 73a, the third connecting pin 73c, the second connecting pin 73b, and the fourth connecting pin 73d are disposed in such positions as to be superposed on regions of formation of the first to fourth pieces of inter-DUT wiring 81 to 84, respectively, in a plane of pattern formation of the DUT 70 (in an X-Y plane in FIG. 15).

Further, in the present embodiment, the first connecting pin 73a and the fourth connecting pin 73d are arranged on a straight line L2 that passes through a center of rotation O in the plane of pattern formation of the DUT 70 and is inclined at 45 degrees to the extending direction of the corresponding inter-DUT wiring (X-axis direction in FIG. 15). Specifically, in the present embodiment, as in the foregoing second embodiment, the first connecting pin 73a and the fourth connecting pin 73d are each disposed such that the respective coordinates of the first connecting pin 73a and the fourth connecting pin 73d are coordinates on the straight line L2 represented by Y=X in an XY rectangular coordinate system having the coordinates of the center of rotation O of the DUT 70 as an origin.

In addition, in the present embodiment, the second connecting pin 73b and the third connecting pin 73c are arranged on a straight line L1 that passes through the center of rotation O in the plane of pattern formation of the DUT 70 and is inclined at 45 degrees to the extending direction of the corresponding inter-DUT wiring (Y-axis direction in FIG. 15). Specifically, as in the foregoing third embodiment, the second connecting pin 73b and the third connecting pin 73c are each disposed such that the respective coordinates of the second connecting pin 73b and the third connecting pin 73c are coordinates on the straight line L1 represented by Y=−X in the XY rectangular coordinate system having the coordinates of the center of rotation O of the DUT 70 as the origin. That is, the arrangement and configuration of the connecting pins in the test structure 150 according to the present embodiment is obtained by combining the configuration of the foregoing second embodiment with the configuration of the foregoing third embodiment.

In addition, in the present embodiment, a body wiring film 35, a source wiring film 76, a drain wiring film 77, and a gate wiring film 38 are each formed by a metallic film extending in substantially the shape of an L in the plane of formation of the DUT 70.

In the present embodiment, however, the pattern of each piece of internal wiring is changed as the positions of the respective connecting pins are changed as described above. Specifically, the L-shaped patterns of the body wiring film 35 and the gate wiring film 38 are similar to those of the foregoing second embodiment. On the other hand, the L-shaped patterns of the source wiring film 76 and the drain wiring film 77 and the L-shaped patterns of the source wiring film 36 and the drain wiring film 37 according to the foregoing second embodiment are respectively axisymmetric with respect to the X-axis direction in FIG. 15.

Incidentally, the test structure 150 according to the present embodiment having the above-described configuration can be designed by a similar procedure to the design procedure for the test structure 100 as described above in the foregoing first embodiment (FIG. 7).

[Operation of Rotating Test Structure]

When the pattern of the DUT 70 is rotated by 90 degrees in a counterclockwise direction relative to the wiring section, even after the rotation, the test structure 150 according to the present embodiment can maintain connection relation between the connecting pins and the pieces of inter-DUT wiring before the rotation. An example of the rotating operation is shown in FIGS. 16A and 16B.

Figure 16A:
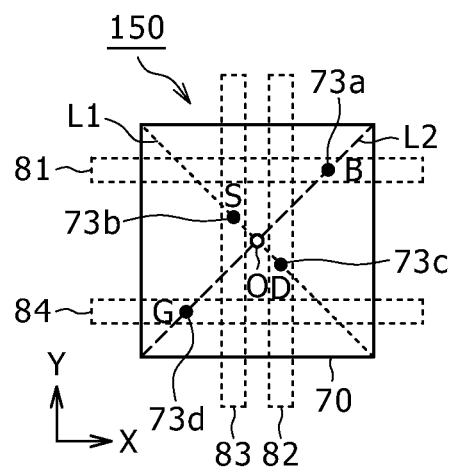
FIGS. 16A and 16B are diagrams of assistance in explaining an example of an operation of rotating the test structure according to the fifth embodiment.

FIG. 16A is a diagram showing the connection relation between the first to fourth connecting pins 73a to 73d of the DUT 70 and the first to fourth pieces of inter-DUT wiring 81 to 84 of the wiring section in the basic state. FIG. 16B is a diagram showing the connection relation between the first to fourth connecting pins 73a to 73d of the DUT 70 and the first to fourth pieces of inter-DUT wiring 81 to 84 of the wiring section after the rotation. Incidentally, FIGS. 16A and 16B do not show a detailed pattern of the DUT 70 to simplify description, but show the positions of the connecting pins and the center of rotation O of the DUT 70 and an outer frame defining the perimeter edge of a region of formation of the DUT 70 in the X-Y plane.

Figure 16B:
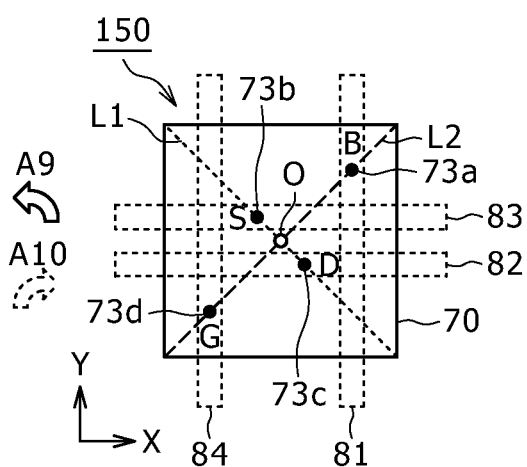

Incidentally, the rotating operation shown in FIGS. 16A and 16B is performed when there is a need to rotate the whole of the test structure 150 by 90 degrees according to the extending direction of a scribe line on which the test structure 150 is disposed, for example.

When the test structure 150 according to the present embodiment is rotated by 90 degrees from the basic state (FIG. 16A), the pattern of the DUT 70 in design data is rotated by 90 degrees in a counterclockwise direction (direction of an arrow A9 in FIG. 16B) relative to the wiring section. In addition, at this time, the whole of the test structure 150 is rotated about the center of rotation O by 90 degrees in a clockwise direction (direction of an arrow A10 in FIG. 16B). As a result, after the rotation, the extending direction of the first piece of inter-DUT wiring 81 and the fourth piece of inter-DUT wiring 84 is the Y-axis direction, and the extending direction of the second piece of inter-DUT wiring 82 and the third piece of inter-DUT wiring 83 is the X-axis direction. However, even after the rotation, the connection relation between the connecting pins (B, S, D, and G in FIG. 16B) and the inter-DUT wiring is the same as that of the basic state (FIG. 16A).

That is, also in the present embodiment, when the test structure 150 is rotated by 90 degrees, the connection relation between the connecting pins and the pieces of inter-DUT wiring can be maintained by rotating the DUT 70 by 90 degrees in an opposite direction from the direction of rotation of the whole of the test structure 150. In addition, at this time, also in the present embodiment, the configuration including the pattern of the various kinds of internal wiring, the positions of the various kinds of contact electrodes, and the like within the DUT 70 does not need to be changed. Therefore, also in the present embodiment, the test structure 150 can be designed more easily, and similar effects to those of the foregoing first embodiment can be obtained.

6. Various Examples of Modification

The configuration of the test structure according to the present disclosure is not limited to the examples of configuration described in the foregoing first to fifth embodiments. It suffices for the connecting pins connecting the DUT to the inter-DUT wiring to pass through the center of rotation O in the plane of pattern formation of the DUT and be disposed at positions on the straight line inclined at a predetermined angle to the extending direction of the inter-DUT wiring. In addition, in this case, it suffices for the connecting pins to be disposed at positions such that the connection relation between the DUT and the inter-DUT wiring is maintained even when the DUT is rotated about the center of rotation O by 90 degrees relative to the inter-DUT wiring in the plane of pattern formation of the DUT. The configuration of the test structure according to the present disclosure other than such arrangement positions of the connecting pins can be designed arbitrarily. Various examples of modification of the test structures according to the foregoing various embodiments will be described in the following.

First Example of Modification

In the foregoing various embodiments, description has been made of an example in which the straight line on which connecting pins are disposed is inclined at 45 degrees to the extending direction of the inter-DUT wiring. However, the present disclosure is not limited to this. For example, when the inter-DUT wiring has a certain margin of line width, the angle between the direction of the straight line on which the connecting pins are disposed and the extending direction of the inter-DUT wiring may differ from 45 degrees within a range in which the connection relation between the DUT and the inter-DUT wiring is maintained when the DUT is rotated by 90 degrees.

In the first example of modification, such examples of arrangement of connecting pins will be described concretely with reference to drawings. Description will be made of an example in which DUT main bodies in test structures according to examples of modification 1-1 and 1-2 to be described in the following are formed by a MOS transistor as in the foregoing various embodiments. Therefore, as in the foregoing various embodiments, DUTs according to the following examples of modification 1-1 and 1-2 have four connecting pins (a first to a fourth connecting pin) respectively provided for a body (well), a source, a drain, and a gate of the MOS transistor. In addition, as in the foregoing various embodiments, description in the following will be made of an example in which the four connecting pins (first to fourth connecting pins) are respectively connected to four corresponding pieces of inter-DUT wiring (a first to a fourth piece of inter-DUT wiring) of a wiring section.

(1) Example of Modification 1-1

In the example of modification 1-1, description will be made of an example of configuration of a test structure in a case where each piece of inter-DUT wiring has a relatively small line width as in the foregoing first embodiment.

Figure 17A:
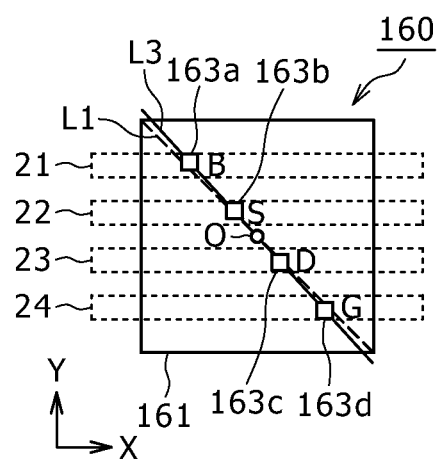
FIGS. 17A and 17B are diagrams showing the arrangement positions of each connecting pin before and after an operation of rotating a test structure according to an example of modification 1-1.
Figure 17B:
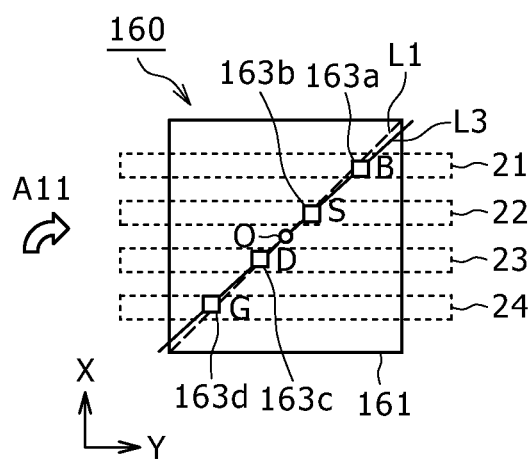

FIGS. 17A and 17B show an example of arrangement of four connecting pins (a first connecting pin 163a to a fourth connecting pin 163d) in a DUT 161 of a test structure 160 according to the example of modification 1-1. FIG. 17A is a diagram showing connection relation between the first to fourth connecting pins 163a to 163d (square marks in the figure) of the DUT 161 and a first to a fourth piece of inter-DUT wiring 21 to 24 in a basic state. FIG. 17B is a diagram showing the connection relation between the first to fourth connecting pins 163a to 163d of the DUT 161 and the first to fourth pieces of inter-DUT wiring 21 to 24 after a rotating operation.

Incidentally, in the test structure 160 shown in FIGS. 17A and 17B, constituent elements similar to those of the test structure 100 according to the foregoing first embodiment shown in FIG. 2 are identified by the same references. In addition, FIGS. 17A and 17B do not show a detailed pattern of the DUT 161 to simplify description, but show the positions of the connecting pins and the center of rotation O of the DUT 161 and an outer frame defining the perimeter edge of a region of formation of the DUT 161 in an X-Y plane.

In the present example, the first to fourth connecting pins 163a to 163d are arranged at such positions as to be superposed on regions of formation of the first to fourth pieces of inter-DUT wiring 21 to 24, respectively, in a plane of pattern formation of the DUT 161 (in the X-Y plane in FIG. 17A). In addition, in the present example, each connecting pin is disposed on a straight line L3 that passes through the center of rotation O in the plane of pattern formation of the DUT 161 and is inclined at an angle slightly different from 45 degrees (angle of inclination of the straight line L1) to the extending direction of the inter-DUT wiring (X-axis direction in FIG. 17A). Further, in the present example, the angle of inclination of the straight line L3 is set at an angle such that connection relation between each connecting pin and the corresponding piece of inter-DUT wiring is maintained even when the pattern of the DUT 161 is rotated by 90 degrees in a clockwise direction (direction of an arrow A11 in FIG. 17B) relative to the wiring section.

Incidentally, the configuration of the test structure 160 according to the example of modification 1-1 other than the arrangement positions of the first to fourth connecting pins 163*a* to 163*d* of the DUT 161 is similar to the corresponding configuration of the test structure 100 according to the foregoing first embodiment.

As described above, in the configuration according to the example of modification 1-1, although the angle between the direction of the straight line L3 on which the connecting pins are disposed and the extending direction of the inter-DUT wiring is somewhat different from 45 degrees, the connection relation between the connecting pins of the DUT 161 and the inter-DUT wiring is maintained even when the DUT 161 is rotated by 90 degrees. Therefore, also in the present example, the test structure 160 can be designed more easily, and similar effects to those of the foregoing first embodiment can be obtained.

(2) Example of Modification 1-2

In the example of modification 1-2, description will be made of an example of configuration of a test structure in which each piece of inter-DUT wiring has a relatively large line width as compared with the foregoing example of modification 1-1 (foregoing various embodiments).

FIGS. 18A and 18B show an example of arrangement of four connecting pins (a first connecting pin 173*a* to a fourth connecting pin 173*d*) in a DUT 171 of a test structure 170 according to the example of modification 1-2. FIG. 18A is a diagram showing connection relation between the first to fourth connecting pins 173*a* to 173*d* (square marks in the figure) of the DUT 171 and a first to a fourth piece of inter-DUT wiring 175 to 178 in a basic state. FIG. 18B is a diagram showing the connection relation between the first to fourth connecting pins 173*a* to 173*d* of the DUT 171 and the first to fourth pieces of inter-DUT wiring 175 to 178 after a rotating operation. In addition, FIGS. 18A and 18B do not show a detailed pattern of the DUT 171 to simplify description, but show the positions of the connecting pins and the center of rotation O of the DUT 171 and an outer frame defining the perimeter edge of a region of formation of the DUT 171 in an X-Y plane.

In the present example, the first to fourth connecting pins 173*a* to 173*d* are arranged at such positions as to be superposed on regions of formation of the first to fourth pieces of inter-DUT wiring 175 to 178, respectively, in a plane of pattern formation of the DUT 171 (in the X-Y plane in FIG. 18A). In addition, in the present example, each connecting pin is disposed on a straight line L4 that passes through the center of rotation O in the plane of pattern formation of the DUT 171 and is inclined at an angle different from 45 degrees (angle of inclination of the straight line L1) to the extending direction of the inter-DUT wiring (X-axis direction in FIG. 18A). Further, in the present example, the angle of inclination of the straight line L4 is set at an angle such that connection relation between each connecting pin and the corresponding piece of inter-DUT wiring is maintained even when the pattern of the DUT 171 is rotated by 90 degrees in a clockwise direction (direction of an arrow A11 in FIG. 18B) relative to the wiring section.

Incidentally, the configuration of the test structure 170 according to the example of modification 1-2 other than the arrangement positions of the first to fourth connecting pins 173*a* to 173*d* of the DUT 171 and the line width of each piece of inter-DUT wiring is similar to the corresponding configuration of the test structure 100 according to the foregoing first embodiment.

As described above, as in the foregoing example of modification 1-1, also in the configuration according to the example of modification 1-2, the angle between the direction of the straight line L4 on which the connecting pins are disposed and the extending direction of the inter-DUT wiring is a value different from 45 degrees. However, also in the present example, the connection relation between the connecting pins of the DUT 171 and the inter-DUT wiring is maintained when the DUT 171 is rotated by 90 degrees. Therefore, also in the present example, the test structure 170 can be designed more easily, and similar effects to those of the foregoing first embodiment can be obtained.

In addition, because the line width of the inter-DUT wiring in the example of modification 1-2 is larger than that of the foregoing example of modification 1-1, an amount of difference of the angle of inclination of the direction of arrangement of the connecting pins (straight line L4) in the example of modification 1-2 from 45 degrees (straight line L1) can be made larger than that of the foregoing example of modification 1-1. That is, when the line width of the inter-DUT wiring is increased as in the example of modification 1-2, a permissible range of the angle of inclination of the direction of arrangement of the connecting pins with respect to the extending direction of the inter-DUT wiring can be increased.

Second Example of Modification

In the foregoing fifth embodiment, an example of configuration obtained by combining the configuration of the foregoing second embodiment with the configuration of the foregoing third embodiment has been described as an example in which the extending direction of a part of a plurality of pieces of inter-DUT wiring and the extending direction of the other pieces of inter-DUT wiring are made orthogonal to each other. However, the present disclosure is not limited to this. For example, the extending direction of a part of a plurality of pieces of inter-DUT wiring and the extending direction of the other pieces of inter-DUT wiring may be made orthogonal to each other by combining the configuration of the foregoing first embodiment with the configuration of the foregoing fourth embodiment. However, also in this case, as in the foregoing fifth embodiment, the part of the plurality of pieces of inter-DUT wiring and the other pieces of inter-DUT wiring are formed in respective separate metallic wiring layers.

Third Example of Modification

In the foregoing first to fourth embodiments, description has been made of an example in which all of the plurality of pieces of inter-DUT wiring are formed in the metal layer M2. However, the present disclosure is not limited to this. In the configurations of the foregoing first to fourth embodiments, a part of the plurality of pieces of inter-DUT wiring and the other pieces of inter-DUT wiring may be formed in respective separate metal layers as in the foregoing fifth embodiment.

Fourth Example of Modification

In the foregoing various embodiments, description has been made of an example in which the shape of the outer frame defining the perimeter edge of the region of formation of the DUT in the plane of pattern formation of the DUT is a square shape. However, the present disclosure is not limited to this. For example, the shape of the outer frame defining the perimeter edge of the region of formation of the DUT in the plane of pattern formation of the DUT may be a rectangular shape.

Fifth Example of Modification

In the foregoing various embodiments, description has been made of an example in which the DUT main body is a MOS transistor. Patent Document 1 also describes a technique limited to a case where the DUT main body is a MOS transistor. However, the techniques for designing the test structures according to the foregoing various embodiments are also applicable to cases where the DUT main body is a device other than a MOS transistor, and the techniques for designing the test structures according to the foregoing various embodiments provide similar effects.

For example, the techniques for designing the test structures according to the foregoing various embodiments are also applicable to cases where the DUT main body is a device such as a resistance element, a capacitance element, or the like. Incidentally, in this case, the number of connecting pins between the DUT and inter-DUT wiring is two or more, though depending on the device forming the DUT main body.

Also in cases where the number of connecting pins is other than four, it suffices for each connecting pin to be disposed at a position on a straight line that passes through the center of rotation O in the plane of pattern formation of the DUT and is inclined at a predetermined angle (substantially 45 degrees) to the extending direction of the corresponding inter-DUT wiring. In this case, all of the plurality of connecting pins may be disposed on one straight line as in the foregoing first to fourth embodiments, or a first straight line on which a part of the plurality of connecting pins are disposed may be different from a second straight line on which the other connecting pins are disposed, as in the foregoing fifth embodiment.

7. Example of Application

Example of Configuration of Integrated Circuit

In the foregoing various embodiments and the foregoing various examples of modification, description has been made of an example in which the design techniques according to the present disclosure are applied to a test structure for wafer inspection. However, the present disclosure is not limited to this. The above-described design techniques are also applicable to a device element section such as a predetermined circuit cell, a hard macro, or the like including a device (for example a device element main body such as a MOS transistor, a resistance element, a capacitance element, or the like) and an integrated circuit including the device element section, which are actually fabricated as products.

For example, when the device included in the device element section is a MOS transistor, it suffices to apply the configurations of the DUTs and the wiring sections according to the foregoing various embodiments and the foregoing various examples of modification (see FIG. 2, for example) to the configurations of the device element section and higher-level wiring (wiring section) thereof, respectively. That is, it suffices to apply, as it is, the layout design pattern of the DUT main bodies and the inter-DUT wiring according to the foregoing various embodiments and the foregoing various examples of modification to the layout design pattern of the MOS transistor included in the predetermined circuit cell or the hard macro and higher-level wiring thereof.

Also in this case, when the layout design pattern of the device element section is rotated by 90 degrees at a time of design of the integrated circuit, it suffices only to rotate only the cell data of the various kinds of device by 90 degrees relative to the wiring section, and the other layout design pattern does not need to be corrected. Therefore, the design of the integrated circuit can be made easier when the techniques for designing the test structures described in the foregoing various embodiments and the foregoing various examples of modification are applied to the design of the integrated circuit.

An example in which the techniques for designing the above-described DUT according to the present disclosure is applied to I/O cells of an integrated circuit will be concretely described in the following with reference to drawings.

[Configuration of Integrated Circuit]

Figure 19:
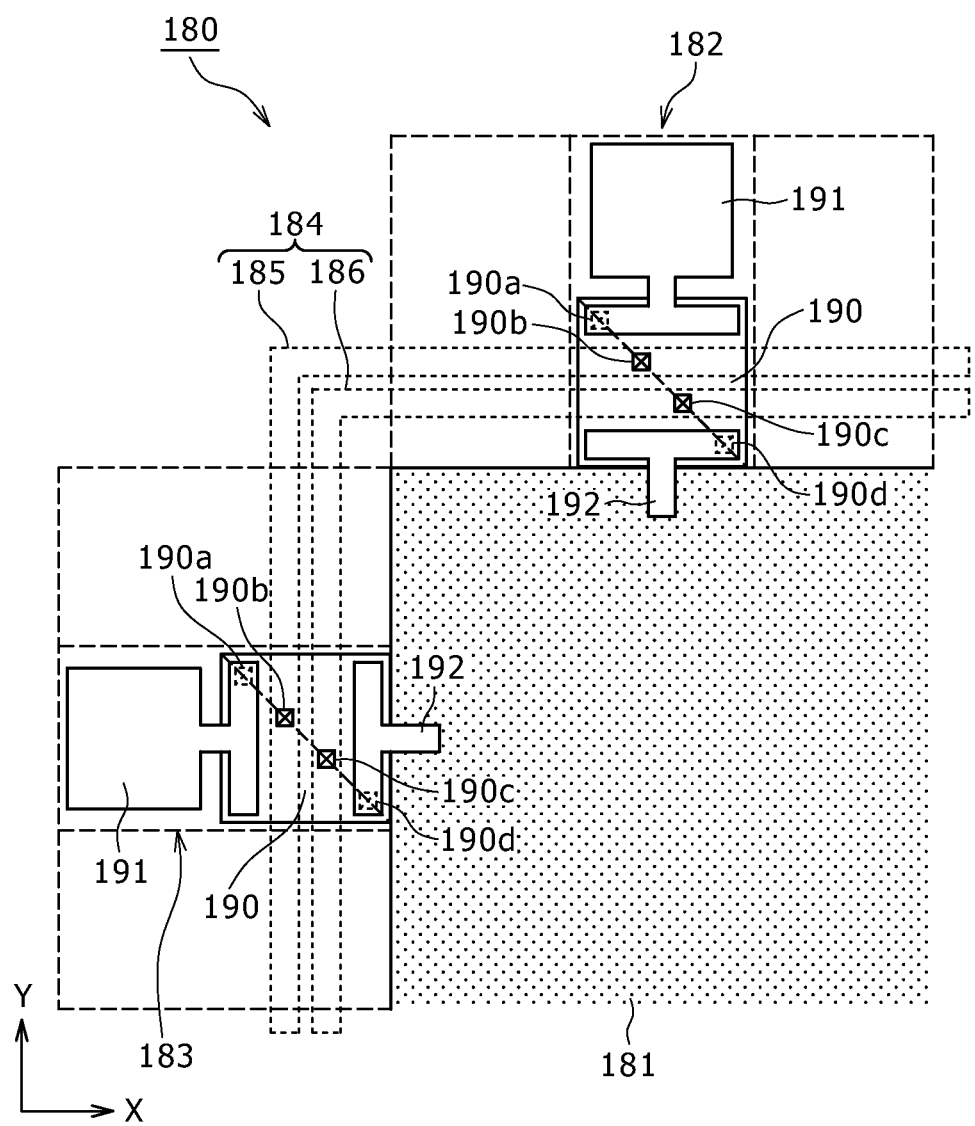
FIG. 19 is a diagram of arrangement and configuration of I/O (Input/Output) cells in an integrated circuit according to an example of application.

FIG. 19 shows a schematic configuration of an integrated circuit fabricated by applying the techniques for designing the above-described DUT according to the present disclosure. Incidentally, FIG. 19 shows only the configuration of a part of I/O cells within the integrated circuit 180 and the vicinity thereof in order to simplify description.

The integrated circuit 180 in the present example includes a chip core section 181 and a plurality of first I/O cells 182 and a plurality of second I/O cells 183 provided on the periphery of the chip core section 181. The integrated circuit 180 further includes a wiring section 184 including VDD power supply wiring 185 and VSS power supply wiring 186 provided so as to be common to each of the I/O cells (device element sections). Incidentally, though not shown in FIG. 19, each part of the integrated circuit 180 is formed on a semiconductor substrate (substrate) not shown in the figure.

Each of the I/O cells is an interface circuit cell for controlling electric connection between a circuit within the chip core section 181 and the outside. Each of the I/O cells can be for example formed by a predetermined circuit including a circuit element such as a MOS transistor or the like. In addition, an input electrode section 191 of each of the I/O cells is connected to an external pin (not shown) or the like via a bonding wire (not shown) or the like. An output electrode section 192 of each of the I/O cells is connected to an electrode of a predetermined circuit or the like within the chip core section 181. Incidentally, the configuration of each of the I/O cells will be described later in detail.

In the example shown in FIG. 19, a region of formation of the chip core section 181 is a square shape or a rectangular shape. The plurality of first I/O cells 182 are arranged on the outside of one pair of opposed side parts (an upper side part and a lower side part (not shown) in FIG. 19) of the region of formation of the chip core section 181. On the other hand, the plurality of second I/O cells 183 are arranged on the outside of another pair of opposed side parts (a left side part and a right side part (not shown) in FIG. 19) of the region of formation of the chip core section 181. In addition, the plurality of first I/O cells 182 and the plurality of second I/O cells 183 are each arranged in one row along the corresponding side parts of the region of formation of the chip core section 181.

In the present example, each of the I/O cells is disposed such that a direction in which the input electrode section 191 and the output electrode section 192 of the I/O cell are opposed to each other is orthogonal to the extending direction of the corresponding side part of the region of formation of the chip core section 181, and is disposed such that the output electrode section 192 is located on the side of the chip core section 181. Therefore, in the integrated circuit 180 shown in FIG. 19, the first I/O cells 182 are I/O cells for vertical placement, and the second I/O cells 183 are I/O cells for horizontal placement.

The VDD power supply wiring 185 and the VSS power supply wiring 186 are disposed on the periphery of the region of formation of the chip core section 181, and are disposed so as to extend in a direction of going around along the side parts of the region of formation of the chip core section 181. In addition, in the present example, the VSS power supply wiring 186 is provided so as to be parallel with the VDD power supply wiring 185, and is disposed at a position nearer to the side of the chip core section 181 than the VDD power supply wiring 185.

The VDD power supply wiring 185 is connected to a second connecting pin 190b of a functional block section 190 to be described later within each I/O cell. The VSS power supply wiring 186 is connected to a third connecting pin 190c of the functional block section 190 to be described later. Incidentally, the VDD power supply wiring 185 and the VSS power supply wiring 186 can be formed in a same metallic wiring layer (metal layer), for example.

[Configuration of I/O Cell]

Figure 20A:
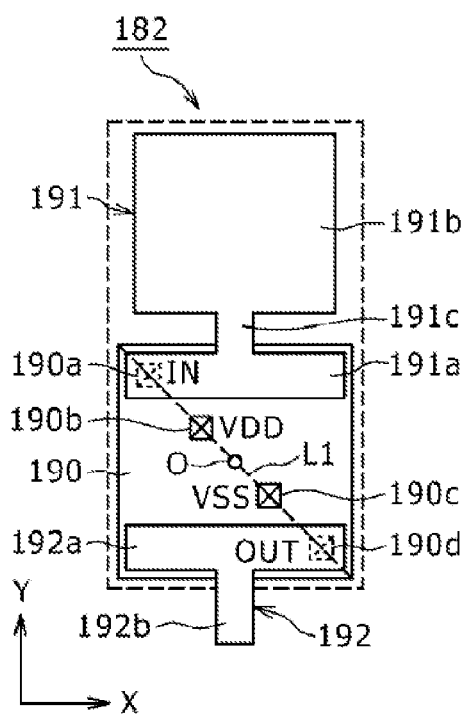
FIGS. 20A and 20B are schematic configuration diagrams of the I/O cells used in the integrated circuit according to the example of application.
Figure 20B:
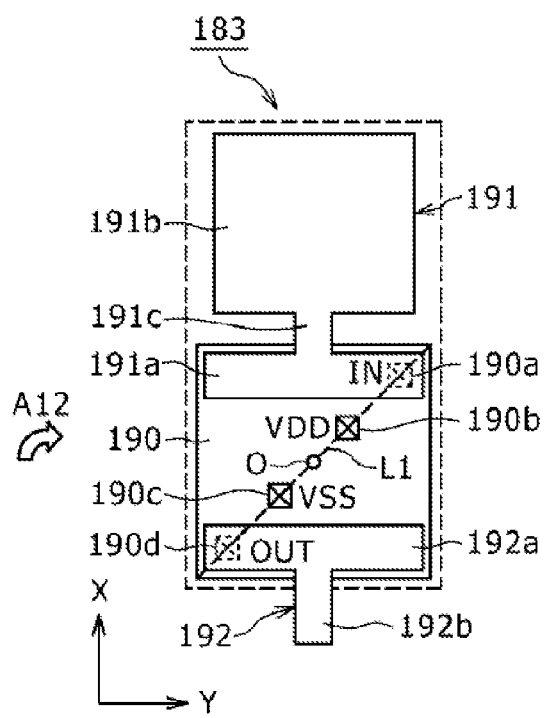
Figure 21:
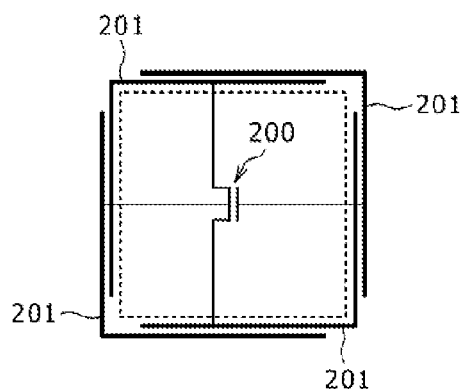
FIG. 21 is a schematic configuration plan view of a test structure in related art.

The configuration of each I/O cell will next be described with reference to FIGS. 20A and 20B. FIGS. 20A and 20B are schematic plan views of the configurations of a first I/O cell 182 and a second I/O cell 183, respectively. Similar constituent elements in each I/O cell are identified by the same references. In addition, FIGS. 20A and 20B do not show a detailed pattern of the functional block section to be described later to simplify description, but show the positions of the connecting pins and the center of rotation O of the functional block section and an outer frame defining the perimeter edge of a region of formation of the functional block section in an X-Y plane. Incidentally, the outer frame defining the perimeter edge of the region of formation of the functional block section (square shape) is set by default by a layout design editor, for example.

The first I/O cell 182 includes a functional block section 190, an input electrode section 191, and an output electrode section 192.

The functional block section 190 includes a predetermined circuit (not shown: a device element main body) including a predetermined circuit element (device) and four connecting electrodes 190a to 190d (hereinafter referred to as a first connecting pin 190a to a fourth connecting pin 190d, respectively). Incidentally, the first connecting pin 190a and the fourth connecting pin 190d are an input terminal and an output terminal, respectively, of the circuit forming the functional block section 190. The second connecting pin 190b and the third connecting pin 190c are both a power supply terminal of the circuit forming the functional block section 190. The first connecting pin 190a, the second connecting pin 190b, the third connecting pin 190c, and the fourth connecting pin 190d are connected to the input electrode section 191, the VDD power supply wiring 185, the VSS power supply wiring 186, and the output electrode section 192, respectively (see FIG. 19).

In addition, though not shown in FIG. 20A, the functional block section 190 also includes internal wiring for connecting the circuit element within the functional block section 190 to the corresponding connecting pins. The internal wiring can be formed in a metal layer at a lower level than a metal layer in which the VDD power supply wiring 185 and the VSS power supply wiring 186 are formed, for example.

In the functional block section 190 in the present example, the first to fourth connecting pins 190a to 190d are arranged at such positions as to be superposed on regions of formation of the input electrode section 191, the VDD power supply wiring 185, the VSS power supply wiring 186, and the output electrode section 192, respectively. Further, the first to fourth connecting pins 190a to 190d are arranged on a straight line L1 that passes through the center of rotation O in the plane of pattern formation of the functional block section 190 and is inclined at 45 degrees to the extending direction of each piece of power supply wiring (X-axis direction in FIG. 20A). More specifically, for example, when an XY rectangular coordinate system (right-handed system) having the coordinates of the center of rotation O (position of the center of rotation) of the functional block section 190 as an origin is set, the first to fourth connecting pins 190a to 190d are disposed at coordinates on the straight line L1 of Y=−X.

The input electrode section 191 includes an input wiring section 191a, an input pad section 191b, and a connecting section 191c.

The input wiring section 191a is an electrode part electrically connected to the first connecting pin 190a, and is formed on the first connecting pin 190a. In the present example, the input wiring section 191a is formed so as to extend in the same direction as the extending direction of the VDD power supply wiring 185 and the VSS power supply wiring 186 (X-axis direction in FIG. 20A). Incidentally, in this case, the input wiring section 191a is formed in a region extending from the vicinity of one side part (left side part in FIG. 20A) of the functional block section 190 which is orthogonal to the extending direction of the input wiring section 191a to the vicinity of another side part (right side part) of the functional block section 190.

In addition, the input pad section 191b is an electrode part to which a bonding wire is attached. The connecting section 191c is an electrode part connecting the input wiring section 191a and the input pad section 191b to each other. As shown in FIG. 20A, the connecting section 191c is formed so as to extend in the shape of a straight line from the center of the input wiring section 191a in the extending direction of the input wiring section 191a to the input pad section 191b (in a Y-axis direction in FIG. 20A).

The output electrode section 192 includes an output wiring section 192a and an output connecting section 192b.

The output wiring section 192a is an electrode part electrically connected to the fourth connecting pin 190d, and is formed on the fourth connecting pin 190d. In the present example, the output wiring section 192a is formed so as to extend in the same direction as the extending direction of the VDD power supply wiring 185 and the VSS power supply wiring 186 (X-axis direction in FIG. 20A). Incidentally, in this case, the output wiring section 192a is formed in a region extending from the vicinity of one side part (left side part in FIG. 20A) of the functional block section which is orthogonal to the extending direction of the output wiring section 192a to the vicinity of the other side part (right side part) of the functional block section.

The output connecting section 192b is an electrode part connected to a predetermined circuit within the chip core section 181. As shown in FIG. 20A, the output connecting section 192b is formed so as to extend with a predetermined length from the center of the output wiring section 192a in the extending direction of the output wiring section 192a to the outside of the region of formation of the functional block section 190 (in the Y-axis direction in FIG. 20A).

Incidentally, for example, the input electrode section 191 and the output electrode section 192 (input-output electrode section) can be formed in a metal layer at a higher level than the metal layer in which the wiring section 184 (the VDD power supply wiring 185 and the VSS power supply wiring 186) is formed. In addition, the planar shapes of the input electrode section 191 and the output electrode section 192 are not limited to the example shown in FIG. 20A, but may be changed as appropriate in consideration of for example the size of the region of formation of the I/O cell, a circuit pattern within the chip core section 181, design rules, and the like.

As shown in FIG. 20B, as with the first I/O cell 182, the second I/O cell 183 includes a functional block section 190, an input electrode section 191, and an output electrode section 192. The second I/O cell 183 has a configuration obtained by rotating only the pattern (cell data) of the functional block section 190 in the first I/O cell 182 by 90 degrees in a clockwise direction (direction of an arrow A12) relative to the pattern of the input-output electrode section. Incidentally, the other configuration of the second I/O cell 183 is similar to the corresponding configuration of the first I/O cell 182.

As described above, in the present example, the configuration (cell data) of each part of the second I/O cell 183 is the same as the corresponding configuration of the first I/O cell 182. Thus, in the present example, the library of the second I/O cell 183 is not created separately from the first I/O cell 182 in advance. Instead, in the present example, as will be described later, the second I/O cell 183 is created by rotating only the cell data of the functional block section 190 of the first I/O cell 182 by 90 degrees in a clockwise direction relative to the pattern of the input-output electrode section at a time of arrangement of I/O cells.

Incidentally, in the integrated circuit 180 in the present example, when the VDD power supply wiring 185, the VSS power supply wiring 186, the input wiring section 191a, and the output wiring section 192a have a certain margin of line width, the design techniques of the foregoing first example of modification may be applied to the present example. That is, an angle between the direction of a straight line on which the connecting pins are disposed and the extending direction of the power supply wiring may differ from 45 degrees within a range in which the connection relation between the functional block section 190 and each piece of power supply wiring and the input-output electrode section is maintained when the functional block section 190 is rotated by 90 degrees.

[Example of I/O Cell Arranging Operation and Rotating Operation]

A brief description will next be made of an operation performed when I/O cells of configurations as described above are arranged on the periphery of the region of formation of the chip core section 181 at a time of design of the integrated circuit 180.

First, in the example shown in FIG. 19, when I/O cells are arranged on the outside of the upper side part of the region of formation of the chip core section 181, the first I/O cell 182 for vertical placement which has been described with reference to FIG. 20A is disposed as it is without being rotated. Incidentally, though not shown in FIG. 19, when I/O cells are arranged on the outside of the lower side part of the region of formation of the chip core section 181, the first I/O cell 182 is disposed after the pattern of the whole of the first I/O cell 182 is rotated by 180 degrees.

In addition, in the example shown in FIG. 19, when I/O cells are arranged on the outside of the left side part of the region of formation of the chip core section 181, the pattern of the whole of the first I/O cell 182 for vertical placement is first rotated by 90 degrees in a counterclockwise direction, and is disposed at predetermined positions on the outside of the left side part. Next, only the pattern (cell data) of the functional block section 190 is rotated by 90 degrees in an opposite direction (clockwise direction) from the direction of rotation of the pattern of the whole of the first I/O cell 182. In the example shown in FIG. 19, the second I/O cell 183 is created from the first I/O cell 182 by such a rotating operation, and the second I/O cell 183 is disposed on the outside of the left side part of the region of formation of the chip core section 181.

Further, though not shown in FIG. 19, when I/O cells are arranged on the outside of the right side part of the region of formation of the chip core section 181, the pattern of the whole of the first I/O cell 182 for vertical placement is first rotated by 270 degrees in a counterclockwise direction, and is disposed at predetermined positions on the outside of the right side part. Next, only the pattern of the functional block section 190 is rotated by 90 degrees in an opposite direction (clockwise direction) from the direction of rotation of the pattern of the whole of the first I/O cell 182. In the example shown in FIG. 19, the second I/O cell 183 is created from the first I/O cell 182 by such a rotating operation, and the second I/O cell 183 is disposed on the outside of the right side part of the region of formation of the chip core section 181. Incidentally, the operation of rotating the pattern (cell data) of the functional block section 190 at the time of creation of the second I/O cell 183 described above can be performed in a similar manner to the methods of DUT rotating operation described in the foregoing various embodiments.

In the present example, the first to fourth connecting pins 190a to 190d of the first I/O cell 182 are arranged on the straight line L1 that passes through the center of rotation O in the plane of pattern formation of the functional block section 190 and is inclined at 45 degrees to the extending direction of the VDD power supply wiring 185. Therefore, also in the second I/O cell 183 created by the above-described rotating operation and disposed on the outside of the left side part and the right side part of the chip core section 181, the connection relation between the connecting pins and each piece of power supply wiring and the input-output electrode section before the rotating operation is maintained even after the rotating operation (see FIG. 19). In addition, when a MOS transistor is included within the circuit of the functional block section 190, the gate direction of the MOS transistor within the second I/O cell 183 is the same as the gate direction of the first I/O cell 182 as a result of the above-described I/O cell rotating operation.

[Various Effects]

As described above, also in the present example, when the layout design pattern of the I/O cell is rotated by 90 degrees at the time of design of the integrated circuit 180, it suffices to rotate only the cell data of the functional block section 190 by 90 degrees in a predetermined direction relative to the wiring section 184. Therefore, when the techniques for designing the test structures described in the foregoing various embodiments are applied to design of the integrated circuit including the I/O cell, the design of the integrated circuit can be made easier. The techniques for designing the integrated circuit 180 in the present example also provide the following various effects as compared with techniques in related art to be described in the following.

In related art, at a time of design of an integrated circuit, an I/O cell of a same pattern (kind) is generally used as an I/O cell common to I/O cells for vertical placement (for disposition along an upper and a lower side part of a chip core section) and I/O cells for horizontal placement (for disposition along a left and a right side part of the chip core section). Consideration will be given to a case where the common I/O cell includes a MOS transistor, and is designed such that the pattern (gate) of a functional block section is oriented in a proper direction when the common I/O cell is disposed on the outside of the upper and lower side parts of the chip core section.

In this case, when I/O cells are arranged on the outside of the left and right side parts of the chip core section, the whole of the cell data of the I/O cells arranged on the outside of the upper and lower side parts of the chip core section is rotated by 90 degrees or 270 degrees. However, in this method, gate directions within the I/O cells are a mixture of a vertical direction and a horizontal direction, so that variations in gate length within the integrated circuit are increased.

On the other hand, in the integrated circuit 180 according to the above-described example of application, even when a MOS transistor is included in the I/O cells, the gate directions of the I/O cells for vertical placement (first I/O cell 182) and the I/O cells for horizontal placement (second I/O cell 183) can be made uniform. Therefore, the above-described example of application can reduce variations in gate length within the I/O cells, and thus solve the problem of the above-described related art.

In addition, as another I/O cell designing and arranging method in related art, there is a method of preparing an I/O cell for vertical placement and an I/O cell for horizontal placement (libraries) separately from each other. In this method, the gate direction of the I/O cell for vertical placement is set in a vertical (or a horizontal) direction, and the gate direction of the I/O cell for horizontal placement is set in a horizontal (or a vertical) direction. Then, the I/O cell for vertical placement is arranged in a vertical placement region (for example regions on the outside of an upper side part and a lower side part) of a peripheral region of a chip core section, and the I/O cell for horizontal placement is arranged in a horizontal placement region (for example regions on the outside of a left side part and a right side part) of the peripheral region of the chip core section. At this time, the gate directions of both of the I/O cells can be made to be a uniform vertical (or horizontal) direction by rotating one of the I/O cell for vertical placement and the I/O cell for horizontal placement by 90 degrees.

However, this method requires two kinds of I/O cell libraries (lineups), and thus increases the trouble of library creation. In addition, this method requires the use of dedicated I/O cells suitable for respective I/O cell arrangement regions according to the I/O cell arrangement regions, and thus decreases a degree of freedom of layout.

On the other hand, in the above-described example of application, the first I/O cell 182 is disposed at a predetermined position, and thereafter the pattern (cell data) of the functional block section 190 is rotated by 90 degrees in a predetermined direction as appropriate according to the arrangement region (a vertical placement region or a horizontal placement region) of the first I/O cell 182. Therefore, the present example eliminates the need to prepare a dedicated I/O cell for vertical placement and a dedicated I/O cell for horizontal placement individually, and can therefore reduce the trouble of library creation and improve the degree of freedom of I/O cell layout.

Further, in related art, Japanese Patent Laid-Open No. 2008-218751, for example, discloses a method of arranging the positions of a plurality of contacts for connecting a plurality of pieces of power supply wiring to the internal wiring of an I/O cell, whose formation region is of a rectangular shape, in an oblique direction with respect to the extending direction of the power supply wiring. According to this document, this design method allows I/O cells to be shared in a case where the directions of long sides of all I/O cells are uniform directions perpendicular to the peripheral sides of a chip core section (normal arrangement) and a case where the directions of the long sides of all the I/O cells are uniform directions parallel to the peripheral sides of the chip core section (90-degree rotation arrangement).

However, in the design method according to the above document, the directions of the long sides of all the I/O cells are perpendicular to or parallel to the peripheral sides of the chip core section. That is, the whole of the I/O cells arranged on the outside of the left and right side parts of the chip core section is disposed in a state of being rotated by 90 degrees relative to the I/O cells arranged on the outside of the upper and lower side parts of the chip core section irrespective of a form of arrangement of the I/O cells (the normal arrangement or the 90-degree rotation arrangement). Therefore, also in this case, the gate direction of the I/O cells arranged on the outside of the upper and lower side parts and the gate direction of the I/O cells arranged on the outside of the left and right side parts are different from each other, so that variations in gate length are increased.

On the other hand, in the foregoing example of application, as described above, the gate direction can be made to be a predetermined uniform direction irrespective of the regions of arrangement of the I/O cells. Therefore the problem of the above document can be solved.

In addition, Japanese Patent Laid-Open No. 2011-91084, for example, discloses a method of arranging I/O cells including a plurality of functional block sections whose formation region is of a rectangular shape on the periphery of a chip core section. In the design method according to this document, the I/O cells are arranged with the gate direction of each functional block section made to be a predetermined uniform direction irrespective of regions of arrangement of the I/O cells. Specifically, when I/O cells arranged on the outside of a left side part of the chip core section are arranged on the outside of an upper side part of the chip core section, the I/O cells are arranged on the outside of the upper side part of the chip core section without each functional block within the I/O cells being rotated.

However, the above document does not discuss arrangement relation between power supply wiring and the contact of each functional block within the I/O cells. In addition, the design method according to the above document requires that a wiring pattern (internal wiring) for connecting each functional block be changed according to a region of arrangement of the I/O cell, and thus requires much time for design.

On the other hand, in the present example, only the pattern (cell data) of the functional block section is rotated by 90 degrees as appropriate according to the region of arrangement of the I/O cell, and the internal wiring does not need to be corrected. Therefore the present example can also solve the problem of the above document.

Incidentally, the present disclosure can also adopt the following constitutions.

(1) A test circuit including:
a substrate;
a wiring section having a plurality of pieces of wiring and formed on the substrate; and
a device-under-test section formed on the substrate, and having a device-under-test main body and a plurality of connecting electrodes for establishing connection between the device-under-test main body and the plurality of pieces of wiring, respectively, an extending direction of a straight line connecting a position of a center of rotation in a plane of pattern formation of the device-under-test main body and each of the plurality of connecting electrodes being inclined at a predetermined angle to an extending direction of the plurality of pieces of the wiring, and the plurality of connecting electrodes being arranged at positions such that connection relation between the plurality of connecting electrodes and the plurality of pieces of wiring is maintained even when the device-under-test main body and the plurality of connecting electrodes are rotated about the position of the center of rotation by 90 degrees relative to the wiring section in the plane of the pattern formation.

(2) The test circuit according to (1),
wherein the predetermined angle is 45 degrees.

(3) The test circuit according to (1) or (2),
wherein when the position of the center of rotation in the plane of the pattern formation of the device-under-test main body is set as an origin, the extending direction of the plurality of pieces of wiring is set as an X-axis direction, and a direction orthogonal to the extending direction of the plurality of pieces of wiring is set as a Y-axis direction, the plurality of connecting electrodes are arranged at positions on a straight line represented by Y=−X in a state before the device-under-test main body and the plurality of connecting electrodes are rotated about the position of the center of rotation by 90 degrees in the plane of the pattern formation.

(4) The test circuit according to (1) or (2),
wherein when the position of the center of rotation in the plane of the pattern formation of the device-under-test main body is set as an origin, the extending direction of the plurality of pieces of wiring is set as an X-axis direction, and a direction orthogonal to the extending direction of the plurality of pieces of wiring is set as a Y-axis direction, the plurality of connecting electrodes are arranged at positions on a straight line represented by Y=X in a state before the device-under-test main body and the plurality of connecting electrodes are rotated by 90 degrees in the plane of the pattern formation.

(5) The test circuit according to (1) or (2),
wherein when the position of the center of rotation in the plane of the pattern formation of the device-under-test main body is set as an origin, the extending direction of the plurality of pieces of wiring is set as a Y-axis direction, and a direction orthogonal to the extending direction of the plurality of pieces of wiring is set as an X-axis direction, the plurality of connecting electrodes are arranged at positions on a straight line represented by Y=−X in a state before the device-under-test main body and the plurality of connecting electrodes are rotated by 90 degrees in the plane of the pattern formation.

(6) The test circuit according to (1) or (2),
wherein when the position of the center of rotation in the plane of the pattern formation of the device-under-test main body is set as an origin, the extending direction of the plurality of pieces of wiring is set as a Y-axis direction, and a direction orthogonal to the extending direction of the plurality of pieces of wiring is set as an X-axis direction, the plurality of connecting electrodes are arranged at positions on a straight line represented by Y=X in a state before the device-under-test main body and the plurality of connecting electrodes are rotated by 90 degrees in the plane of the pattern formation.

(7) The test circuit according to (1) or (2),
wherein the wiring section has first wiring formed so as to extend in a predetermined direction and second wiring formed so as to extend in a direction orthogonal to the predetermined direction,
the device-under-test section has a first connecting electrode for establishing connection between the device-under-test main body and the first wiring and a second connecting electrode for establishing connection between the device-under-test main body and the second wiring, and
when the position of the center of rotation in the plane of the pattern formation of the device-under-test main body is set as an origin, the extending direction of the first wiring is set as an X-axis direction, and the extending direction of the second wiring is set as a Y-axis direction, the first connecting electrode is disposed at a position on a straight line represented by Y=X and the second connecting electrode is disposed at a position on a straight line represented by Y=−X in a state before the device-under-test main body and the plurality of connecting electrodes are rotated by 90 degrees in the plane of the pattern formation.

(8) The test circuit according to any one of (1) to (7),
wherein the device-under-test main body is a metal oxide semiconductor transistor, and the device-under-test section has four connecting electrodes connected to a gate, a source, a drain, and a well, respectively, of the metal oxide semiconductor transistor, and
the wiring section has four pieces of wiring connected to the four connecting electrodes, respectively.

(9) An integrated circuit including:
a substrate;
a wiring section having a plurality of pieces of wiring and formed on the substrate; and
a device element section formed on the substrate, and having a device element main body and a plurality of connecting electrodes for establishing connection between the device element main body and the plurality of pieces of wiring, respectively, an extending direction of a straight line connecting a position of a center of rotation in a plane of pattern formation of the device element main body and each of the plurality of connecting electrodes being inclined at a predetermined angle to an extending direction of the plurality of pieces of wiring, and the plurality of connecting electrodes being arranged at positions such that connection relation between the plurality of connecting electrodes and the plurality of pieces of wiring is maintained even when the device element main body and the plurality of connecting electrodes are rotated about the position of the center of rotation by 90 degrees relative to the wiring section in the plane of the pattern formation.

(10) The integrated circuit according to (9),
wherein the device element section is an input/output cell.

(11) A test circuit layout method including:
creating a layout pattern of a wiring section having a plurality of pieces of wiring; and
creating a layout pattern of a device-under-test section having a device-under-test main body and a plurality of connecting electrodes for establishing connection between the device-under-test main body and the plurality of pieces of wiring, respectively, an extending direction of a straight line connecting a position of a center of rotation in a plane of pattern formation of the device-under-test main body and each of the plurality of connecting electrodes being inclined at a predetermined angle to an extending direction of the plurality of pieces of wiring, and the plurality of connecting electrodes being arranged at positions such that connection relation between the plurality of connecting electrodes and the plurality of pieces of wiring is maintained even when the device-under-test main body and the plurality of connecting electrodes are rotated about the position of the center of rotation by 90 degrees relative to the wiring section in the plane of the pattern formation.

The present disclosure contains subject matter related to that disclosed in Japanese Priority Patent Application JP 2012-043216 filed in the Japan Patent Office on Feb. 29, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A test circuit comprising:
a substrate;
a wiring section having a plurality of pieces of wiring and formed on said substrate; and
a device-under-test section formed on said substrate, and having a device-under-test main body and a plurality of connecting electrodes for establishing connections between said device-under-test main body and said plurality of pieces of wiring, respectively,
wherein an extending direction of a straight line connecting a position of a center of rotation in a plane of pattern formation of said device-under-test main body and each of said plurality of connecting electrodes is inclined at a predetermined angle to an extending direction of said plurality of pieces of wiring, and said plurality of connecting electrodes are arranged at positions such that connection relations between said plurality of connecting electrodes and said plurality of pieces of wiring are maintained even when said device-under-test main body and said plurality of connecting electrodes are rotated about said position of said center of rotation by 90 degrees relative to said wiring section in said plane of said pattern formation.

2. The test circuit according to claim 1, wherein said predetermined angle is 45 degrees.

3. The test circuit according to claim 1, wherein when said position of said center of rotation in said plane of said pattern formation of said device-under-test main body is set as an origin, said extending direction of said plurality of pieces of wiring is set as an X-axis direction, and a direction orthogonal to said extending direction of said plurality of pieces of wiring is set as a Y-axis direction, said plurality of connecting electrodes are arranged at positions on a straight line represented by Y=−X in a state before said device-under-test main body and said plurality of connecting electrodes are rotated about said position of said center of rotation by 90 degrees in said plane of said pattern formation.

4. The test circuit according to claim 1, wherein when said position of said center of rotation in said plane of said pattern formation of said device-under-test main body is set as an origin, said extending direction of said plurality of pieces of wiring is set as an X-axis direction, and a direction orthogonal to said extending direction of said plurality of pieces of wiring is set as a Y-axis direction, said plurality of connecting electrodes are arranged at positions on a straight line represented by Y=X in a state before said device-under-test main body and said plurality of connecting electrodes are rotated by 90 degrees in said plane of said pattern formation.

5. The test circuit according to claim 1, wherein when said position of said center of rotation in said plane of said pattern formation of said device-under-test main body is set as an origin, said extending direction of said plurality of pieces of wiring is set as a Y-axis direction, and a direction orthogonal to said extending direction of said plurality of pieces of wiring is set as an X-axis direction, said plurality of connecting electrodes are arranged at positions on a straight line represented by Y=−X in a state before said device-under-test main body and said plurality of connecting electrodes are rotated by 90 degrees in said plane of said pattern formation.

6. The test circuit according to claim 1, wherein when said position of said center of rotation in said plane of said pattern formation of said device-under-test main body is set as an origin, said extending direction of said plurality of pieces of wiring is set as a Y-axis direction, and a direction orthogonal to said extending direction of said plurality of pieces of wiring is set as an X-axis direction, said plurality of connecting electrodes are arranged at positions on a straight line represented by Y=X in a state before said device-under-test main body and said plurality of connecting electrodes are rotated by 90 degrees in said plane of said pattern formation.

7. The test circuit according to claim 1,
wherein said wiring section has a first wiring formed so as to extend in a predetermined direction and a second wiring formed so as to extend in a direction orthogonal to said predetermined direction, said device-under-test section has a first connecting electrode for establishing a connection between said device-under-test main body and said first wiring and a second connecting electrode for establishing a connection between said device-under-test main body and said second wiring, and when said position of said center of rotation in said plane of said pattern formation of said device-under-test main body is set as an origin, said extending direction of said first wiring is set as an X-axis direction, and said extending direction of said second wiring is set as a Y-axis direction, said first connecting electrode is disposed at a position on a straight line represented by Y=X and said second connecting electrode is disposed at a position on a straight line represented by Y=−X in a state before said device-under-test main body and said plurality of connecting electrodes are rotated by 90 degrees in said plane of said pattern formation.

8. The test circuit according to claim 1, wherein said device-under-test main body is a metal oxide semiconductor transistor, and said device-under-test section has four connecting electrodes connected to a gate, a source, a drain, and a well, respectively, of said metal oxide semiconductor transistor, and said wiring section has four pieces wiring of said plurality of pieces of wiring connected to said four connecting electrodes, respectively.

9. An integrated circuit comprising:
a substrate;
a wiring section having a plurality of pieces of wiring and formed on said substrate; and
a device element section formed on said substrate, and having a device element main body and a plurality of connecting electrodes for establishing connections between said device element main body and said plurality of pieces of wiring, respectively,
wherein an extending direction of a straight line connecting a position of a center of rotation in a plane of pattern formation of said device element main body and each of said plurality of connecting electrodes is inclined at a predetermined angle to an extending direction of said plurality of pieces of wiring, and said plurality of connecting electrodes are arranged at positions such that connection relations between said plurality of connecting electrodes and said plurality of pieces of wiring are maintained even when said device element main body and said plurality of connecting electrodes are rotated about said position of said center of rotation by 90 degrees relative to said wiring section in said plane of said pattern formation.

10. The integrated circuit according to claim 9, wherein said device element section is an input/output cell.

11. A test circuit layout method comprising:
in a computing device:
creating a layout pattern of a wiring section having a plurality of pieces of wiring; and
creating a layout pattern of a device-under-test section having a device-under-test main body and a plurality of connecting electrodes for establishing connections between said device-under-test main body and said plurality of pieces of wiring, respectively,
wherein an extending direction of a straight line connecting a position of a center of rotation in a plane of pattern formation of said device-under-test main body and each of said plurality of connecting electrodes is inclined at a predetermined angle to an extending direction of said plurality of pieces of wiring, and said plurality of connecting electrodes are arranged at positions such that connection relations between said plurality of connecting electrodes and said plurality of pieces of wiring are maintained even when said device-under-test main body and said plurality of connecting electrodes are rotated about said position of said center of rotation by 90 degrees relative to said wiring section in said plane of said pattern formation.

* * * * *